United States Patent

Shirato et al.

(10) Patent No.: US 7,608,928 B2
(45) Date of Patent: Oct. 27, 2009

(54) LAMINATED BODY AND SEMICONDUCTOR DEVICE

(75) Inventors: Kaori Shirato, Yokkaichi (JP); Atsushi Shiota, Ushiku (JP); Masahiro Tada, Fujisawa (JP); Sumitoshi Asakuma, Setagaya-ku (JP)

(73) Assignees: JSR Corporation, Tokyo (JP); Sumitomo Bakelite Co., Ltd., Tokyo (JP)

( * ) Notice: Subject to any disclaimer, the term of this patent is extended or adjusted under 35 U.S.C. 154(b) by 192 days.

(21) Appl. No.: 11/597,172

(22) PCT Filed: May 20, 2005

(86) PCT No.: PCT/JP2005/009259

§ 371 (c)(1),
(2), (4) Date: Apr. 30, 2007

(87) PCT Pub. No.: WO2005/114724

PCT Pub. Date: Dec. 1, 2005

(65) Prior Publication Data

US 2008/0044664 A1 Feb. 21, 2008

(30) Foreign Application Priority Data

May 21, 2004 (JP) .............................. 2004-152045

(51) Int. Cl.
*H01L 23/48* (2006.01)
*H01L 23/52* (2006.01)

(52) U.S. Cl. .................. 257/760; 257/508; 257/758; 257/E21.579

(58) Field of Classification Search ............. 257/508, 257/758, 760
See application file for complete search history.

(56) References Cited

U.S. PATENT DOCUMENTS

| 5,602,060 | A |  | 2/1997 | Kobayashi et al. |
| 6,204,565 | B1 | * | 3/2001 | Shimoto et al. ............. 257/783 |
| 6,518,390 | B2 | * | 2/2003 | Okanuma et al. ........... 528/176 |
| 7,022,582 | B2 | * | 4/2006 | Sezi ........................... 438/422 |
| 2001/0004539 | A1 | * | 6/2001 | Kirchhoff et al. ............ 438/238 |
| 2003/0067077 | A1 | * | 4/2003 | Lee ............................. 257/758 |
| 2003/0134950 | A1 | * | 7/2003 | Kudo et al. .................. 524/262 |
| 2003/0219973 | A1 | * | 11/2003 | Townsend et al. ........... 438/631 |
| 2004/0119164 | A1 | * | 6/2004 | Kurashima et al. .......... 257/758 |

FOREIGN PATENT DOCUMENTS

| JP | 5 205526 | 8/1993 |
| JP | 11 228674 | 8/1999 |
| JP | 11 349683 | 12/1999 |
| JP | 2000 31137 | 1/2000 |
| JP | 2000 191752 | 7/2000 |
| JP | 2001 335748 | 12/2001 |
| JP | 2001 354904 | 12/2001 |
| JP | 2002 20689 | 1/2002 |

(Continued)

*Primary Examiner*—Thanh V Pham
*Assistant Examiner*—Duy T Nguyen
(74) *Attorney, Agent, or Firm*—Oblon, Spivak, McClelland, Maier & Neustadt, L.L.P.

(57) ABSTRACT

A laminate includes a copper wiring layer (20) provided over a semiconductor layer and having a specific pattern, a protective layer (30) formed of a polybenzoxazole resin layer provided on the copper wiring layer (20), and an insulating layer (40) provided on the protective layer.

10 Claims, 1 Drawing Sheet

FOREIGN PATENT DOCUMENTS

| | | |
|---|---|---|
| JP | 2002 151500 | 5/2002 |
| JP | 2002 167442 | 6/2002 |
| JP | 2002 222860 | 8/2002 |
| JP | 2002 299441 | 10/2002 |
| JP | 2003 110018 | 4/2003 |

* cited by examiner

LAMINATED BODY AND SEMICONDUCTOR DEVICE

TECHNICAL FIELD

The present invention relates to a laminate of an insulating layer which may be suitably used when forming a wiring layer in the manufacture of semiconductor devices, and particularly to a laminate which may be suitably used to form a wiring layer with a dual damascene structure.

BACKGROUND ART

In recent years, a multilevel wiring technology has been used to connect wires formed in different layers in order to deal with scaling down of semiconductor devices. As a related-art example of the multilevel wiring technology, a structure can be given which includes a first wiring layer provided on a first insulating layer, an interlayer dielectric which covers the first wiring layer and has a contact hole over the wiring layer, and a second wiring layer provided over the contact hole. In this case, a contact layer (conductive layer) is provided in the contact hole to electrically connect the first wiring layer and the second wiring layer. Copper may be used as the conductive material for the contact layer. Copper has an advantage in that an RC delay can be reduced so that the operation speed can be increased. On the other hand, since copper is a material which is easily diffused into an insulating layer such as an interlayer dielectric, a barrier layer for preventing diffusion may be formed on copper when forming a wire using copper. A silicon nitride film may be used as the material for the barrier layer. However, since the silicon nitride film has a high dielectric constant, a signal delay may occur even if diffusion of copper is prevented. As another material used for the barrier layer, a polycarbosilane film obtained by curing a polycarbosilane compound can be given (see U.S. Pat. No. 5,602,060). The polycarbosilane film disclosed in U.S. Pat. No. 5,602,060 film-forming composition to a substrate and heating the applied composition in an oxidizing atmosphere.

DISCLOSURE OF THE INVENTION

However, it is difficult to control the thickness of the film using the above method. Moreover, a further improvement in thermal stability is demanded.

An object of the invention is to provide a laminate in which an insulating layer is provided on a wiring layer formed of a conductive layer containing copper and in which diffusion of copper into the insulating layer contacting the wiring layer is reduced.

Another object of the invention is to provide a semiconductor device including a wiring layer formed in the insulating layer of the above laminate using a dual damascene method.

A laminate according to the invention comprises:
a copper wiring layer provided over a semiconductor layer and having a specific pattern;
a protective layer formed of a polybenzoxazole resin layer provided on the copper wiring layer; and
an insulating layer provided on the protective layer;
wherein a wiring layer is formed in the insulating layer using a dual damascene method. The term "copper wiring layer" used herein refers to a wiring layer formed of a material containing copper.

The laminate according to the invention may have the following features.

In the laminate according to the invention, the insulating layer may be a silica film or an organic film.

In the laminate according to the invention, the insulating layer may include a silica film and an organic film stacked in layers.

In the laminate according to the invention, the insulating layer may include a first organic film, a silica film, and a second organic film stacked in that order.

In the laminate according to the invention, the insulating layer may include a first silica film, an organic film, and a second silica film stacked in that order.

The laminate according to the invention may further comprise a hard mask layer provided on the insulating layer.

In the laminate according to the invention, the polybenzoxazole resin layer may be formed of a resin having a repeating unit of the following general formula (1),

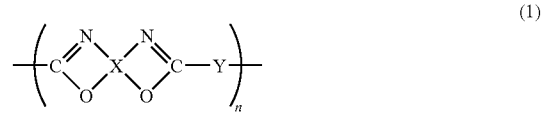

wherein X represents at least one group selected from groups of the following formula (2), Y represents at least one group selected from groups of the following formula (3), and n represents an integer from 1 to 10,000,

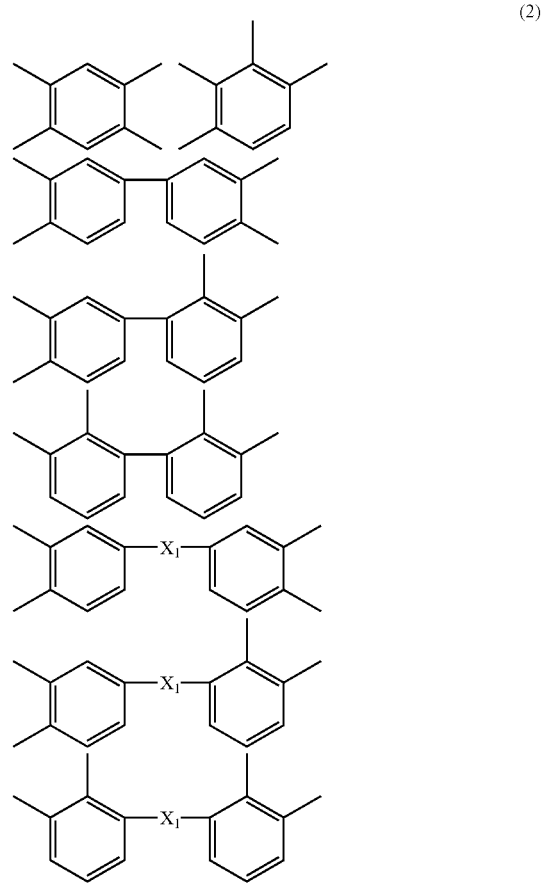

-continued

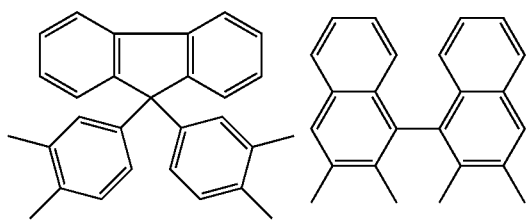

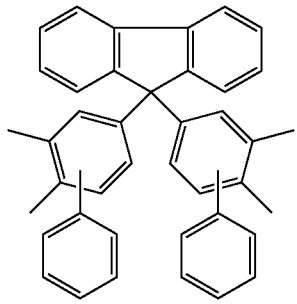

(3)

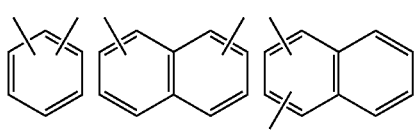

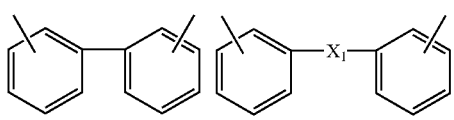

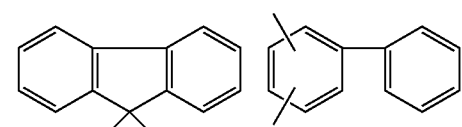

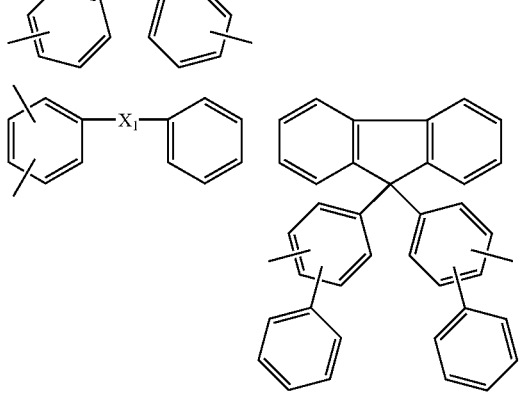

-continued

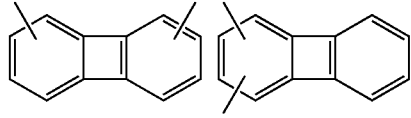

wherein $X_1$ represents a group selected from groups of the following formula (4), (4)

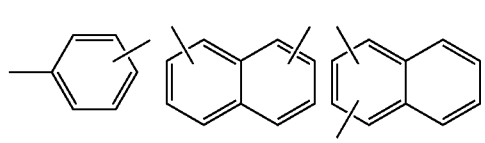

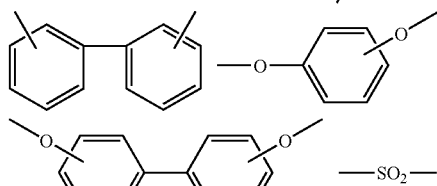

—SO$_2$—

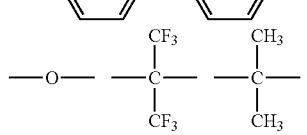

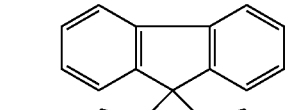

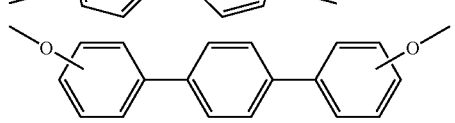

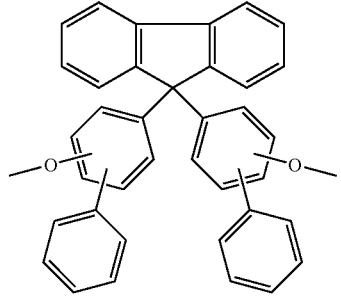

provided that a hydrogen atom on the benzene ring of the groups of the formulas (2), (3), and (4) may be replaced with a crosslinking group, or may be replaced with at least one organic group which is selected from aliphatic groups and aromatic groups and may have a crosslinking group.

In the laminate according to the invention, the polybenzoxazole resin layer may be formed of a resin having, as Y in the repeating unit of the general formula (1), at least one group selected from the groups of the formula (3) in which a hydrogen atom on the benzene ring is replaced with an ethynyl group or a phenylethynyl group.

In the laminate according to the invention, the polybenzoxazole resin layer may be formed of a resin having at least one group selected from groups of the following formula (5) or (6) as Y in the repeating unit of the general formula (1).
(5)
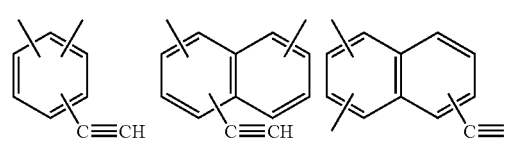
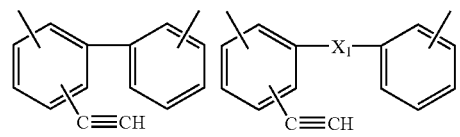
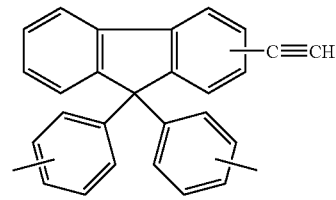
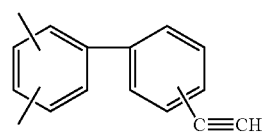
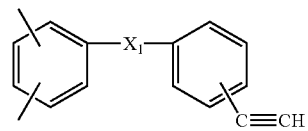
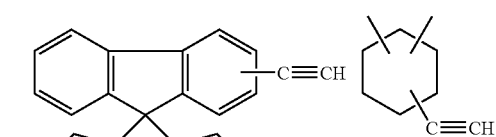
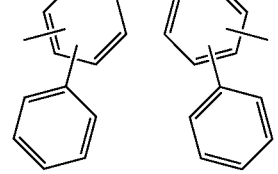
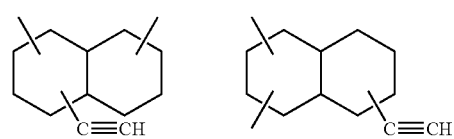
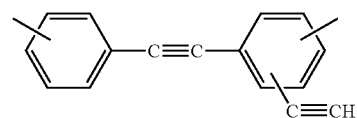
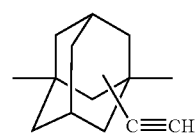
-continued
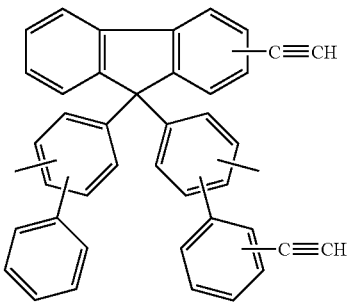
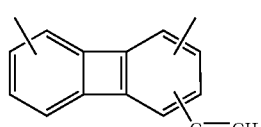
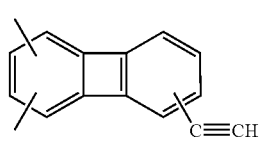
(6)
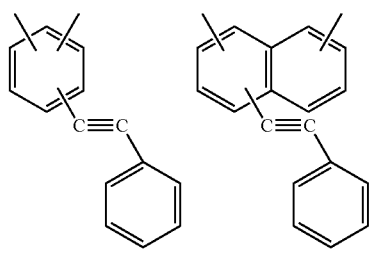
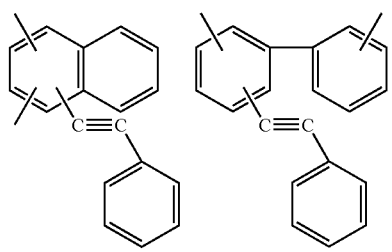
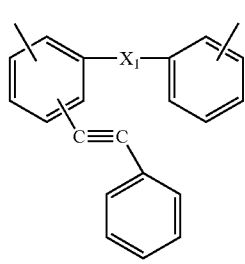
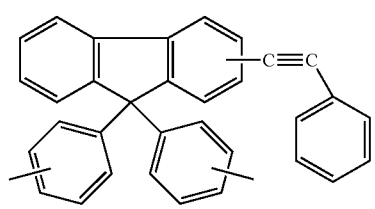

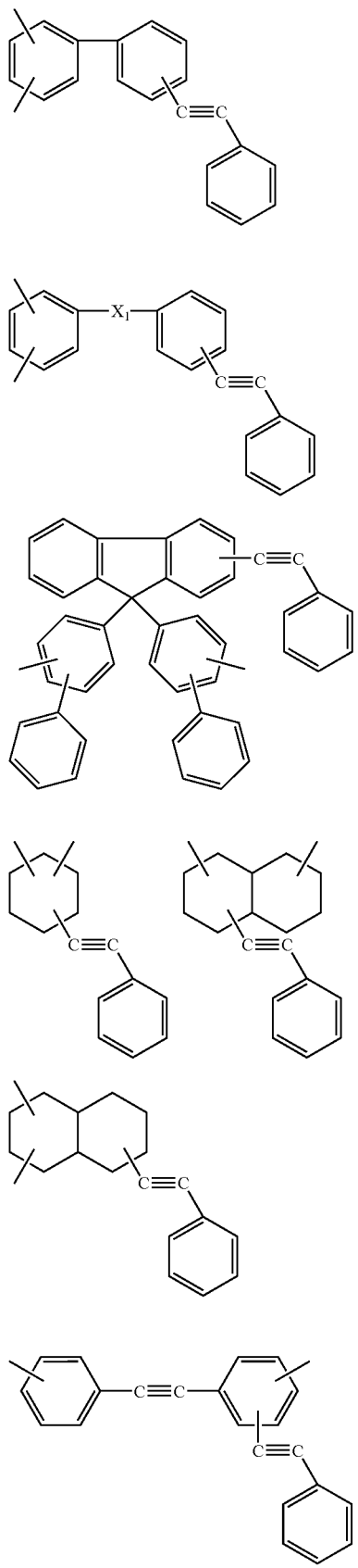

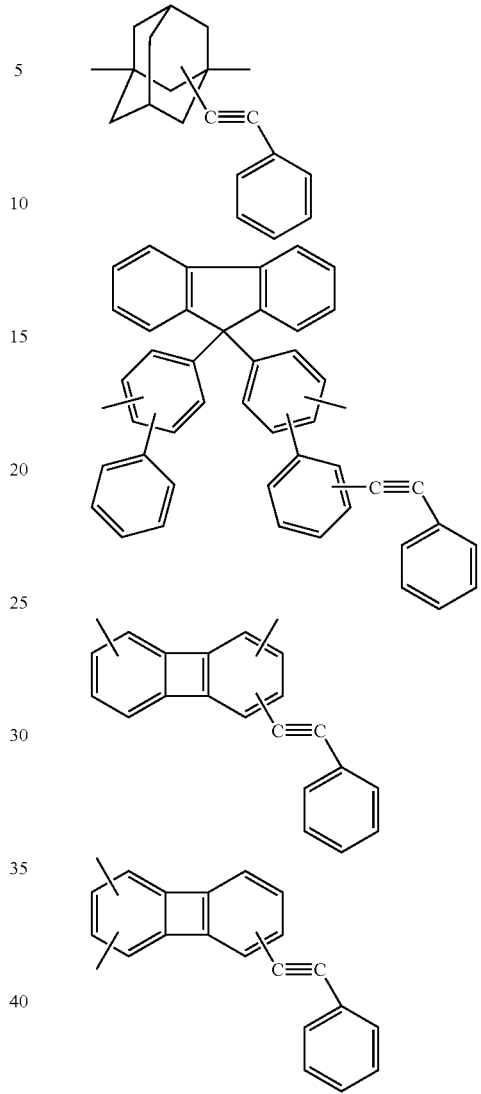

In the laminate according to the invention, the organic film may have a relative dielectric constant of 3 or less.

In the laminate according to the invention, the organic film may be a film formed of at least one resin selected from polybenzoxazole, polyarylene, polyarylene ether, polyimide, and polyamide.

In the laminate according to the invention, the silica film may be a film produced by heating a hydrolysis-condensation product obtained by hydrolyzing and condensing at least one compound selected from the group consisting of compounds of the following general formulas (7) to (10), $$HSi(OR^1)_3 \qquad (7)$$

wherein $R^1$ represents a monovalent organic group, $$R_aSi(OR^2)_{4-a} \qquad (8)$$

wherein R represents a fluorine atom or a monovalent organic group, $R^2$ represents a monovalent organic group, and a represents an integer of 1 or 2, $$Si(OR^3)_4 \qquad (9)$$

wherein $R^3$ represents a monovalent organic group,

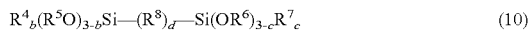 (10)

wherein $R^4$ to $R^7$ individually represent monovalent organic groups, b and c individually represent integers from 0 to 2, $R^8$ represents an oxygen atom, a phenylene group, or a group —$(CH_2)_n$— (wherein n represents an integer from 1 to 6), and d represents 0 or 1.

In the laminate according to the invention, the hard mask layer may be a layer including at least one of a silica film and an organic film.

The laminate according to the invention includes the protective layer formed of the polybenzoxazole resin layer which covers at least the upper surface of the copper wiring layer, and the insulating layer provided on the protective layer. Since the oolybenzoxazole resin layer exhibits a low dielectric constant, a high density, and a high glass transition temperature, diffusion of a metal (e.g. copper) as the material for the conductive layer can be reduced. Therefore the laminate according to the invention allows provision of a laminate which includes a highly reliable insulating film due to a reduction in diffusion of copper into the insulating layer.

A semiconductor device according to the invention comprises a wiring layer formed in the insulating layer of the above laminate using a dual damascene method.

BEST MODE FOR CARRYING OUT THE INVENTION

1. Laminate

The invention is described below in more detail with reference to FIGS. 1 to 3. The laminate according to the invention is a laminate which may be suitably used when forming on a copper wire a wiring layer connected with the copper wiring layer using a dual damascene method. The structure of the laminate and layers forming the laminate are described below in that order.

FIRST EXAMPLE

A laminate according to a first example is described below with reference to FIG. 1. FIG. 1 is a cross-sectional view schematically showing the laminate according to the first example.

Figure 1:
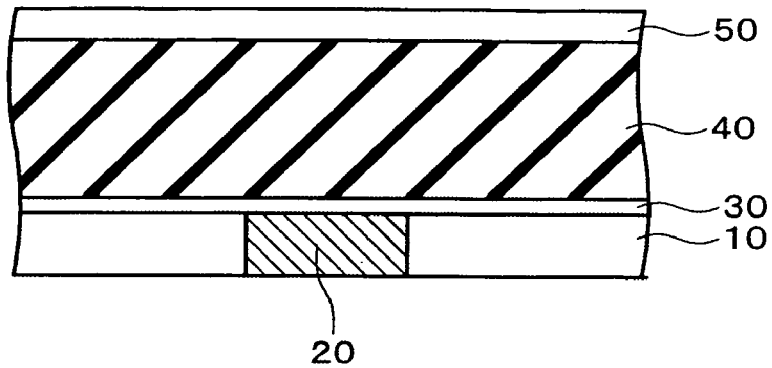
FIG. 1 is a cross-sectional view schematically showing a laminate according to a first example.

As shown in FIG. 1, a wiring layer 20 formed of a conductive layer of a copper-containing material is provided in a first insulating layer 10, and a protective layer 30 is provided on the wiring layer 20. A single-layer second insulating layer 40 is provided on the protective layer 30, and a hard mask layer 50 is provided on the second insulating layer 40, as required. A polybenzoxazole resin layer is used as the protective layer 30. The details of the polybenzoxazole resin layer are described later. A silica film or an organic film may be used as the second insulating layer 40.

SECOND EXAMPLE

A laminate according to a second example is described below with reference to FIG. 2. FIG. 2 is a cross-sectional view schematically showing the laminate according to the second example. The laminate according to the second example differs from the laminate according to the first example as to the configuration of the second insulating layer 40. The difference from the laminate according to the first example is described below.

Figure 2:
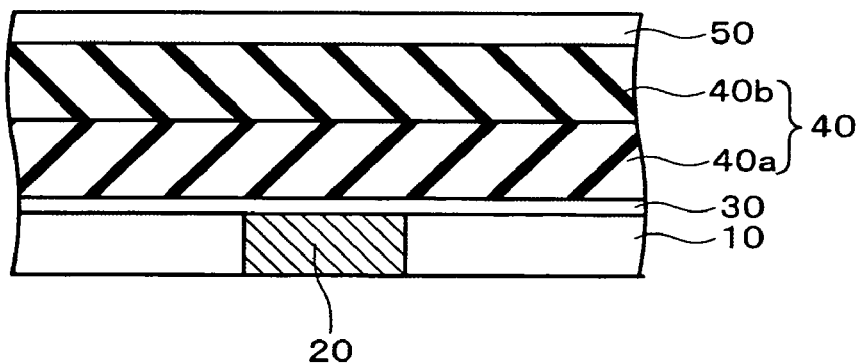
FIG. 2 is a cross-sectional view schematically showing a laminate according to a second example.

As shown in FIG. 2, the wiring layer 20 formed of a conductive layer of a copper-containing material is provided in the first insulating layer 10. The protective layer 30, the second insulating layer 40, and the hard mask layer 50, as required, are provided on the wiring layer 20 in that order. In laminate according to the second example, the second insulating layer 40 is formed of a plurality of layers of different materials. FIG. 2 shows the case where the second insulating layer 40 is formed by stacking an insulating layer 40a formed of a silica film and an insulating layer 40b formed of an organic film. FIG. 2 shows the case where the insulating layer 40a adjacent to the wiring layer 20 is a silica film. Note that the invention is not limited thereto. The insulating layer 40a may be an organic film, and the insulating layer 40b may be a silica film.

THIRD EXAMPLE

A laminate according to a third example is described below with reference to FIG. 3. FIG. 3 is a cross-sectional view schematically showing the laminate according to the third example. The laminate according to the third example differs from the laminate according to the first example as to the configuration of the second insulating layer 40. The difference from the laminate according to the first example is described below.

Figure 3:
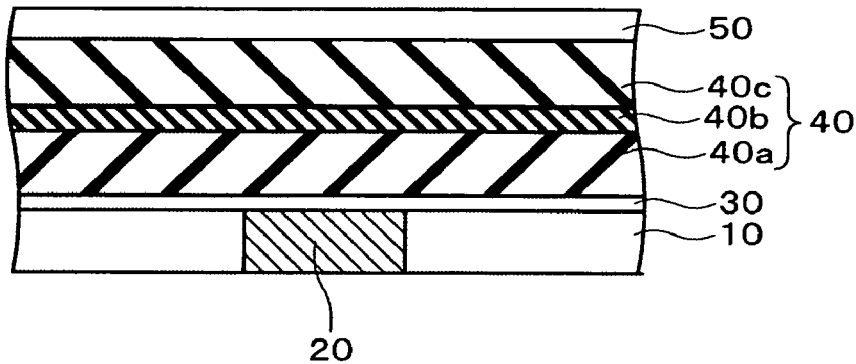
FIG. 3 is a cross-sectional view schematically showing a laminate according to a third example.

As shown in FIG. 3, the wiring layer 20 formed of a conductive layer of a copper-containing material is provided in the first insulating layer 10. The protective layer 30, the second insulating layer 40, and the hard mask layer 50, as required, are provided on the wiring layer 20 in that order. In the laminate according to the third example, the second insulating layer 40 is formed of a plurality of layers in the same manner as in the second example. In the example shown in FIG. 3, the second insulating layer 40 is formed by stacking the insulating layer 40a, the insulating layer 40b, and an insulating layer 40c in that order. The insulating layers 40a and 40c are silica films (or organic films), and the insulating layer 40b is an organic film (or silica film).

In the laminates according to the first to third examples, the protective layer 30 formed of the polybenzoxazole resin layer is provided on at least the upper surface of the wiring layer 20. The polybenzoxazole resin layer exhibits a low relative dielectric constant, a high density, and a high glass transition temperature. Therefore, the material forming the wiring layer 20 can be prevented from being diffused into the second insulating layer 40. As a result, when applying the laminate according to this embodiment to manufacture a semiconductor device, a highly reliable semiconductor device can be provided in which wiring layers are sufficiently insulated.

2. Layers Forming Laminate

The layers forming the laminates according to the first to third examples are described below.

2.1. Wiring Layer

The wiring layer 20 has a specific pattern. As the material for the wiring layer 20, a known conductive material can be given. The wiring layer 20 includes copper. The wiring layer 20 need not be formed of a single metal layer, and may have a stacked structure with a metal nitride layer or a metal oxide layer. As examples of the wiring layer 20, a titanium nitride layer, a tantalum nitride layer, aluminum, an aluminum alloy layer, copper, a copper alloy layer, and the like can be given. The wiring layer is formed on a conductive layer or an insulating layer.

2.2. Protective Layer

The protective layer 30 prevents the metal forming the wiring layer 20 from being diffused into the insulating layer (not shown) formed over the wiring layer 20. A polybenzoxazole resin layer may be used as the protective layer 30.

2.2.1. Polybenzoxazole Resin Layer

The polybenzoxazole resin layer according to the invention is preferably formed of a polybenzoxazole resin having a repeating unit of the following general formula (1).

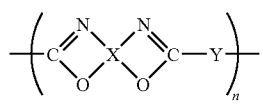

(1)

wherein X represents at least one group selected from groups of the following formula (2), Y represents at least one group selected from groups of the following formula (3), and n represents an integer from 1 to 10,000.

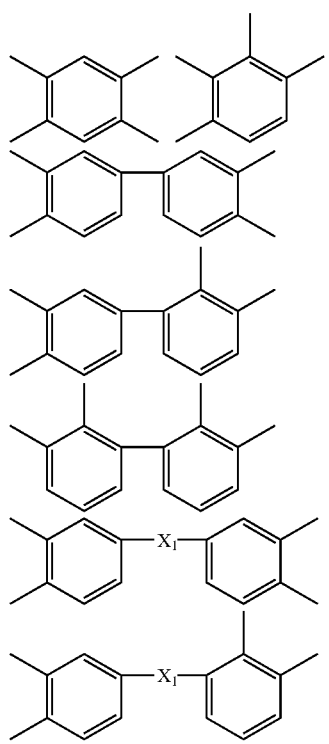

(2)

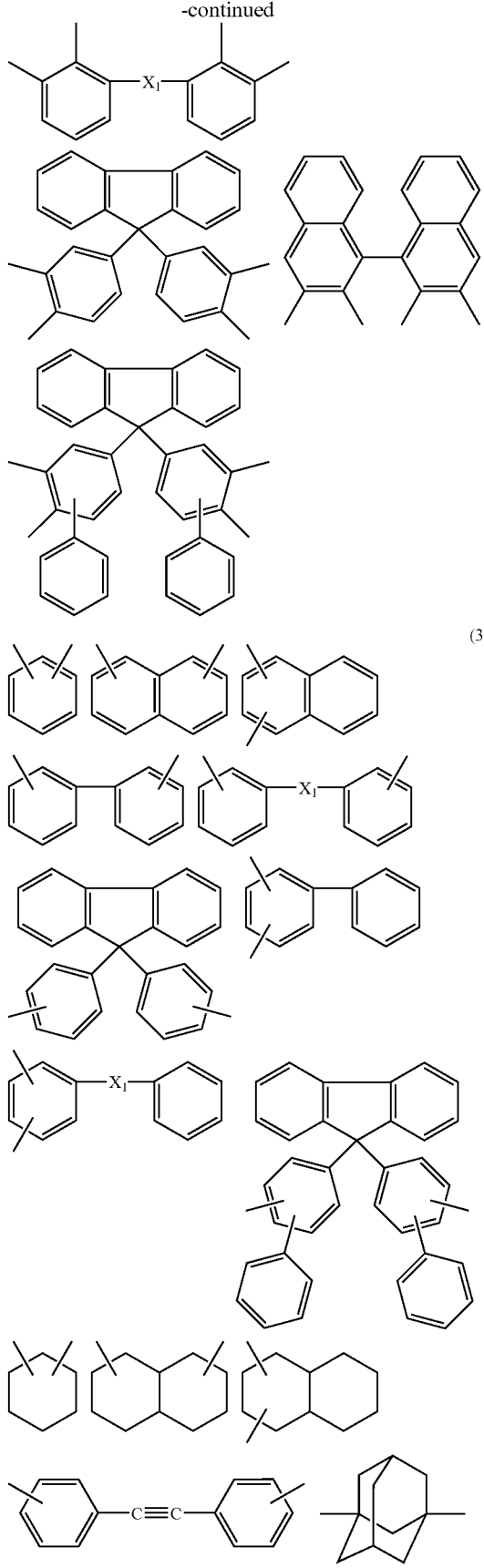

(3)

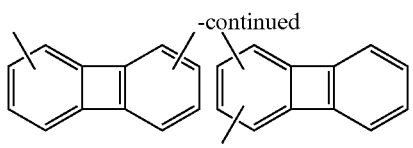

wherein $X_1$ represents a group selected from groups of the following formula (4).

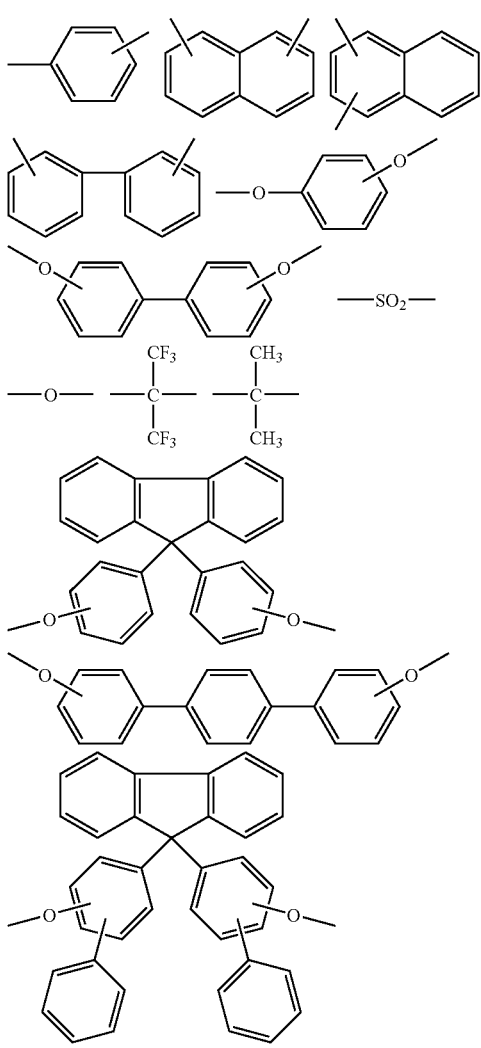

(4)

A hydrogen atom on the benzene ring of the groups of the formulas (2), (3), and (4) may be replaced with a crosslinking group, or may be replaced with at least one organic group selected from aliphatic groups and aromatic groups and having a crosslinking group. As examples of the aliphatic groups, a methyl group, an ethyl group, a propyl group, an isopropyl group, a butyl group, an isobutyl group, a t-butyl group, a trimethylsilyl group, a triethylsilyl group, an adamantyl group, a cyclohexyl group, and the like can be given. As examples of the aromatic groups, a phenyl group and the like can be given. As examples of the crosslinking group, groups having a carbon-carbon double bond such as a maleimide group, a nadimide group, a vinyl group, and a cyclopentadi-enyl group, groups having a carbon-carbon triple bond such as an ethynyl group, a phenylethynyl group, a naphthylethynyl group, an anthrylethynyl group, a quinolylethynyl group, a quinoxalylethynyl group, an alkylethynyl group, and a propargyl ether group, a biphenylene group, a cyanato group, and the like can be given. In particular, groups having a carbon-carbon triple bond such as an ethynyl group and a phenylethynyl group are preferable. This improves the heat resistance of the resulting polybenzoxazole resin.

The polybenzoxazole resin layer according to the invention may be formed of a resin having, as Y in the repeating unit of the general formula (1), at least one group selected from the groups of the formula (3) in which a hydrogen atom on the benzene ring is replaced with an ethynyl group or a phenylethynyl group.

The polybenzoxazole resin layer according to the invention may be formed of a resin having at least one group selected from groups of the following formula (5) or (6) as Y in the repeating unit of the general formula (1).

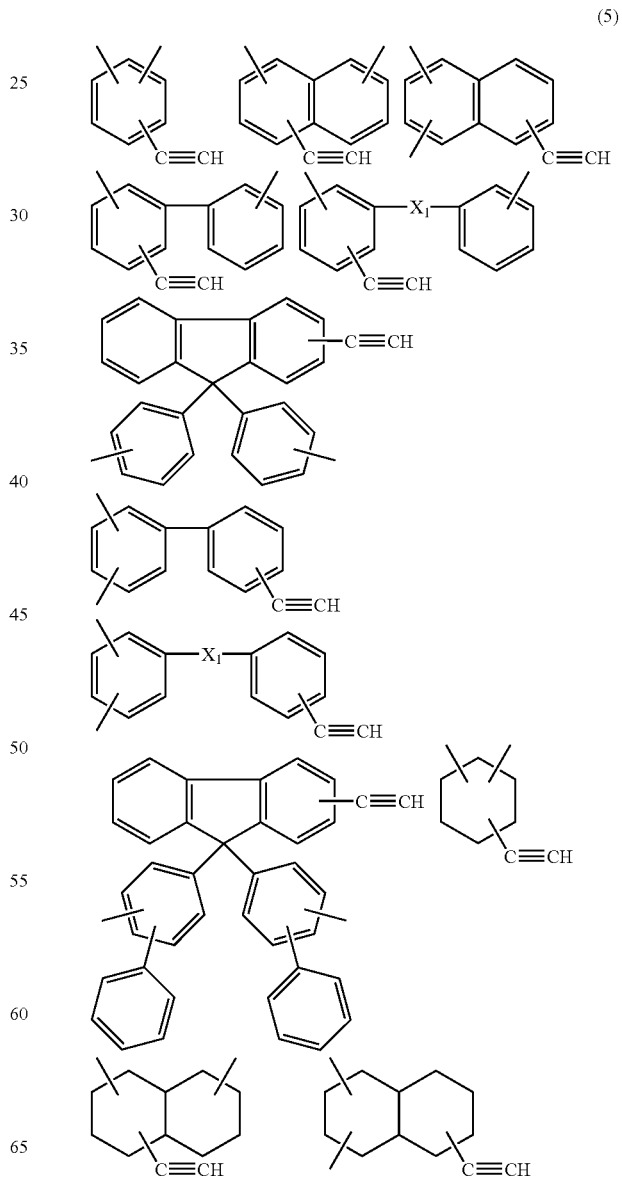

(5)

-continued
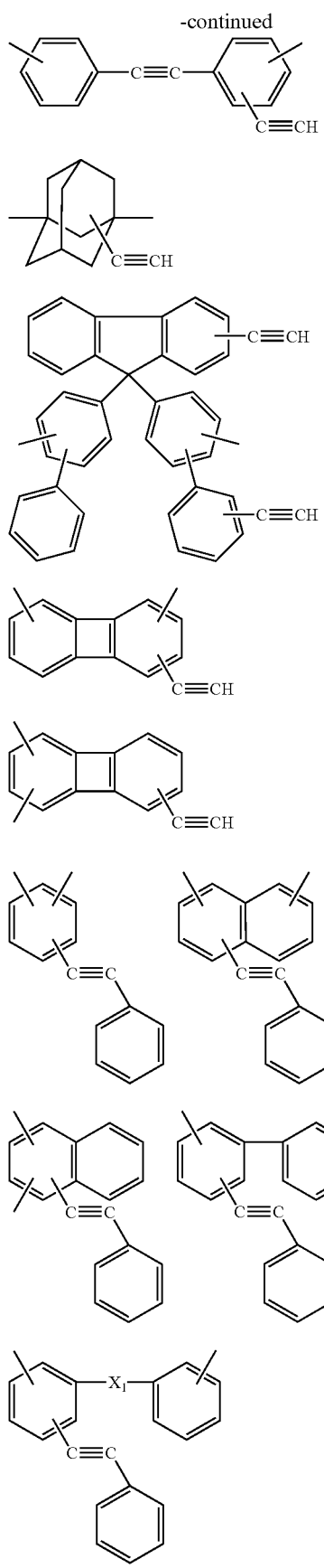
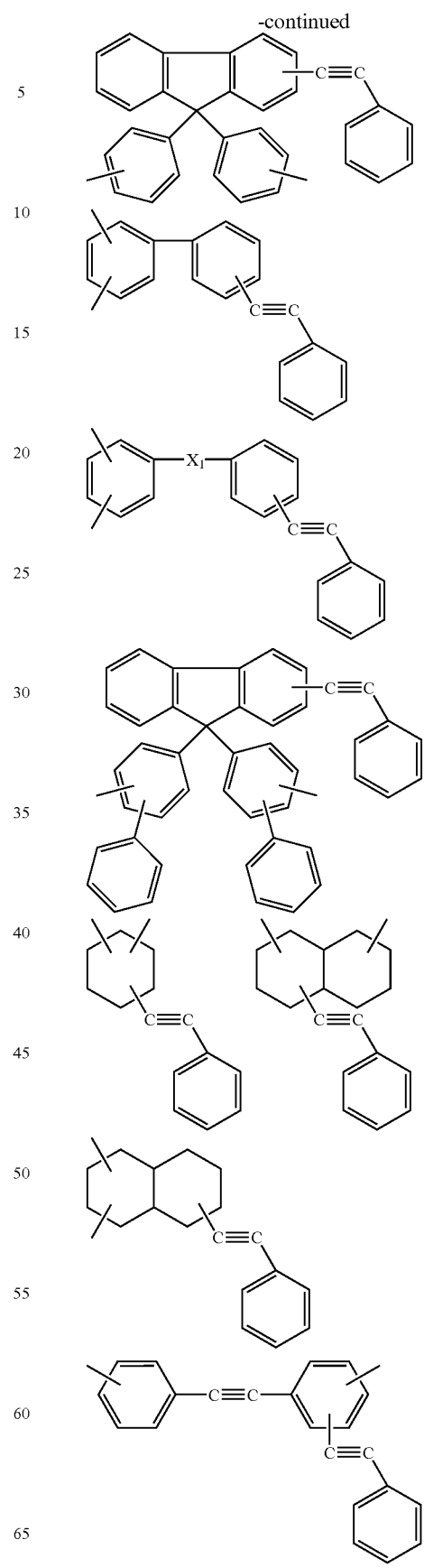
(6)

-continued

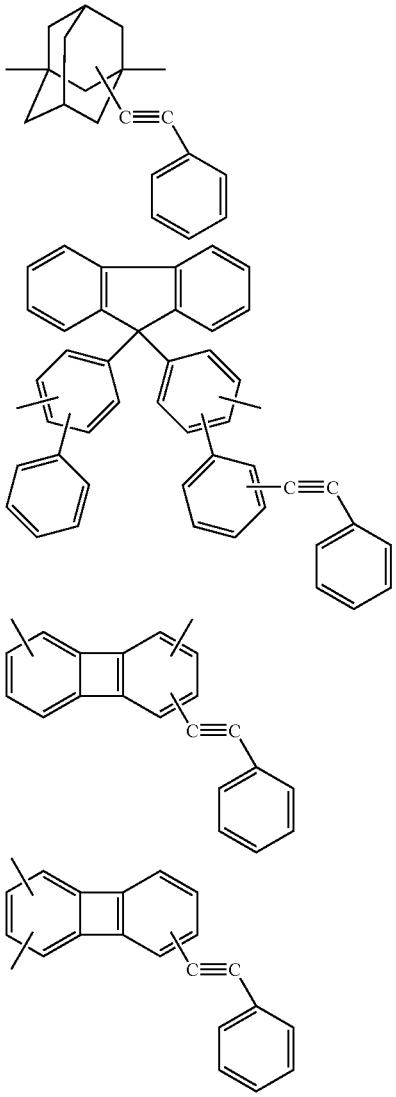

2.2.2. Polybenzoxazole

The polybenzoxazole used in the invention may be synthesized by reacting a bisaminophenol compound and a dicarboxylic acid using an acid chloride method, an active ester method, condensation in the presence of a dehydration condensing agent such as polyphosphoric acid or dicyclohexylcarbodiimide, or the like.

Polybenzoxazole having the repeating unit of the general formula (1) may be obtained by reacting a bisaminophenol compound having one group selected from the groups of the formula (2) forming the structure represented by X in the general formula (1) and a dicarboxylic acid having one group selected from the groups of the formula (4) forming the structure represented by Y in the general formula (1).

The bisphenol compound and the dicarboxylic acid compound for synthesizing polybenzoxazole having the repeating unit of the general formula (1) are described below.

2.2.2.1. Bisaminophenol Compound

As examples of the bisaminophenol compound, compounds containing dihydroxybenzene such as 2,4-diamino-resorcinol and 2,5-diamino-1,4-dihydroxybenzene;

bisaminophenol compounds containing dihydroxy-biphenyl such as 3,3'-diamino-4,4'-dihydroxy-biphenyl and 3,3'-dihydroxy-4,4'-diamino-biphenyl;

bisaminophenol compounds containing dihydroxy-diphenyl ether such as 3,3'-diamino-4,4'-dihydroxy-diphenyl ether;

compounds having a fluorene skeleton such as 9,9-bis(3-amino-4-hydroxy-phenyl)fluorene and 9,9-bis(4-(4-amino-3-hydroxy)-phenoxy-phenyl)fluorene;

compounds having a binaphthalene skeleton such as 2,2-bis-(4-amino-3-hydroxy-phenoxy)-1,1'-binaphthalene;

compounds containing a sulfone group such as 3,3-diamino-4,4'-dihydroxy-diphenylsulfone, bis(4-(4-amino-hydroxy)-phenoxy-phenyl)sulfone, and bis(4-(4-hydroxy-3-amino)phenoxy-phenyl)sulfone; and compounds containing fluorine or a fluorinated alkyl group such as 2,2-bis(3-amino-4-hydroxyphenyl)hexafluoropropane can be given. These compounds may be used either individually or in combination of two or more.

Of these compounds, one or more bisaminophenol compounds selected from the compounds containing dihydroxybenzene, the compounds having a fluorene skeleton, and the compounds having a binaphthalene skeleton are preferable. This improves the heat resistance of the resulting polybenzoxazole resin.

As examples of the bisaminophenol compound containing a crosslinking group, bisaminophenol compounds containing ethynyl(phenylethynyl)-binaphthalene such as 2,2'-bis(3-hydroxy-(4-aminophenoxy)-6,6'-bisethynyl-1,1'-binaphthalene and 2,2'-bis-(3-hydroxy-aminophenoxy)-6,6'-bis-phenylethynyl-1,1'-binaphthalene; bisaminophenol compounds containing ethynyl(phenylethynyl)-naphthalene such as 1,5-bis-(3-hydroxy-4-aminophenoxy)-2,6-bis-ethynyl-naphthalene, 1,5-bis-(3-hydroxy-4-aminophenoxy)-2,6-bisphenylethynyl-naphthalene), 1,5-bis-(3-hydroxy-4-aminophenoxy)-2-phenylethynylnaphthalene, and 1,5-bis-(3-hydroxy-4-aminophenoxy)-3-phenylethynylnaphthalene; bisaminophenol compounds containing ethynyl(phenylethynyl)-fluorene such as 9,9-bis-4-(3-hydroxy-4-aminophenoxy)phenyl-2,7-bis-ethynyl-fluorene, 9,9-bis-4-(3-hydroxy-4-aminophenoxy)phenyl-2,7-bis-phenylethynyl-fluorene, 9,9-bis(3 -amino-4-hydroxy-phenyl)-2,7-bis-ethynyl-fluorene, and 9,9-bis(3 -amino-4-hydroxy-phenyl)-2,7-bis-phenylethynyl-fluorene; bisaminophenol compounds containing ethynyl(phenylethynyl)-benzene such as 1,3-bis-(3-hydroxy-4-aminophenoxy)-4-ethynyl-benzene, 1,3-bis-(3-hydroxy-4-aminophenoxy)-4-phenylethynyl-benzene, 1,4-bis-(3-hydroxy-4-aminophenoxy)-3-ethynyl-benzene, and 1,4-bis-(3-hydroxy-4-aminophenoxy)-3-phenylethynyl-benzene;

bisaminophenol compounds containing ethynyl(phenylethynyl)-diphenyl ether such as 3,3'-diamino-4,4'-dihydroxy-2-phenylethynyl-diphenyl ether, 3,3'-diamino-4,4'-dihydroxy-5 -phenylethynyl-diphenyl ether, and 3,3'-diamino-4, 4'-dihydroxy-6-phenylethynyl-diphenyl ether;

bisaminophenol compounds containing ethynyl(phenylethynyl)-biphenyl such as
3,3'-diamino-4,4'-dihydroxy-2-phenylethynyl-biphenyl
3,3'-diamino-4,4'-dihydroxy-5-phenylethynyl-biphenyl ether, and
3,3'-diamino-4,4'-dihydroxy-6-phenylethynyl-biphenyl ether;

bisaminophenol compounds containing ethynyl(phenylethynyl)-diphenylsulfone such as
3,3'-diamino-4,4'-dihydroxy-6,6'-diphenylethynyl-diphenylsulfone, 3,3'-dihydroxy-4,4'-diamino-6,6'-diphenylethynyl-diphenyl-sulfone, and
3,3'-diamino-4,4'-dihydroxy-2,2'-diphenylethynyl-diphenyl-sulfone;

bisaminophenol compounds containing ethynyl(phenylethynyl)-phenyl-propane such as
2,2-bis-(3-amino-4-hydroxy-6-ethynyl-phenyl)-propane,
2,2-bis-(3-amino-4-hydroxy-6-phenylethynyl-phenyl)-propane,
2,2-bis-(3-hydroxy-4-amino-6-phenylethynyl-phenyl)-propane, and
2,2-bis-(3-amino-4-hydroxy-2-phenylethynyl-phenyl)-propane;

bisaminophenol compounds containing ethynyl(phenylethynyl)-phenyl-hexafluoropropane such as 2,2-bis-(3-amino-4-hydroxy-6-ethynyl-phenyl)-hexafluoropropane, 2,2-bis-(3-amino-4-hydroxy-6-phenylethynyl-phenyl) -hexafluoropropane, 2,2-bis-(3-hydroxy-4-amino-6-phenylethynyl-phenyl) -hexafluoropropane, and 2,2-bis-(3-amino-4-hydroxy-2-phenylethynyl-phenyl) -hexafluoropropane; and the like can be given. These compounds may be used either individually or in combination of two or more.

Of these compounds, one or more bisaminophenol compounds containing a crosslinking group selected from the compounds containing ethynyl(phenylethynyl)-naphthalene and the bisaminophenol compounds containing ethynyl(phenylethynyl)-fluorene are preferable. This allows a crosslinking reaction to occur in a three-dimensional network by heating the polybenzoxazole resin, whereby the heat resistance of the resulting polybenzoxazole resin can be further improved.

2.2.2.2. Dicarboxylic Acid

As examples of the dicarboxylic acid compound, phthalic acid such as isophthalic acid, terephthalic acid, 2-fluoroisophthalic acid, and 2,3,5,6-tetrafluoroterephthalic acid; dicarboxylic acids having a biphenyl skeleton such as 4,4'-biphenyldicarboxylic acid,
3,4'-biphenyldicarboxylic acid, 3,3'-biphenyldicarboxylic acid,
4,4'-bis(4-carboxyphenoxy)biphenyl, and 4,4'-bis(3-carboxyphenoxy)biphenyl; dicarboxylic acids having a naphthalene skeleton such as 1,4-napthalenedicarboxylic acid,
2,3-napthalenedicarboxylic acid, and 2,6-napthalenedicarboxylic acid;
bisbenzoic acid such as 4,4'-sulfonylbisbenzoic acid, 3,4'-sulfonylbisbenzoic acid,
3,3'-sulfonylbisbenzoic acid, 4,4'-oxybisbenzoic acid, 3,4'-oxybisbenzoic acid, and
3,3'-oxybisbenzoic acid;
bis-carboxyphenylprupane(hexafluoropropane) such as
2,2-bis(4-carboxyphenyl)propane,
2,2-bis(3-carboxyphenyl)propane, 2,2-bis(4-carboxyphenyl) hexafluoropropane, and
2,2-bis(3-carboxyphenyl)hexafluoropropane;
dicarboxylic acids having a fluorene skeleton such as
9,9-bis(4-(4-carboxyphenoxy)phenyl)fluorene,
9,9-bis(4-(3-carboxyphenoxy)phenyl)fluorene,
9,9-bis(2-carboxyphenyl)fluorene, and
9,9-bis (3-carboxyphenyl) fluorene;
dicarboxylic acids having an adamantane skeleton such as 1,3-adamantanedicarboxylic acid,
2,5-dimethyladamantane- 1,3-dicarboxylic acid,
2,5-diphenyladamantane- 1,3-dicarboxylic acid, and
2,5-bis(t-butyl)adamantane- 1,3-dicarboxylic acid;
bis-carboxyphenyl-terphenyl compounds such as
4,4'bis(4-carboxyphenoxy)-p-terphenyl and 4,4'-bis(4-carboxyphenoxy)-m-terphenyl; and the like can be given. These compounds may be used either individually or in combination of two or more.

Of these compounds, one or more dicarboxylic acid compounds selected from the compounds having a bisbenzoic acid skeleton are preferable. This improves the adhesion of the polybenzoxazole resin layer.

As examples of the dicarboxylic acid containing a crosslinking group,
ethynylphthalic acid such as 3-ethynylphthalic acid, 4-ethynylphthalic acid, 5-ethynylisophthalic acid, 2-ethynylterephthalic acid, and 3-ethynylterephthalic acid;
ethynyl-napthalenedicarboxylic acids such as 2-ethynyl-1,5-napthalenedicarboxylic acid and 3-ethynyl-1,5-napthalenedicarboxylic acid;
diethynyl-biphenyldicarboxylic acid such as 4,4'-diethynyl-2,2'-biphenyldicarboxylic acid and 5,5'-diethynyl-2,2'-biphenyldicarboxylic acid;
bis(carboxy-ethynylphenyl)propane such as 2,2-bis(2-carboxy-3-ethynylphenyl)propane and 2,2-bis(2-carboxy-4-ethynylphenyl)propane;
bis(carboxy-ethynylphenyl)hexafluoropropane such as 2,2-bis(2-carboxy-4-ethynylphenyl)hexafluoropropane and 2,2-bis(3-carboxy-5-ethynylphenyl)hexafluoropropane;
(ethynyl-phenyl)-phthalic acid such as 5-(1-ethynyl-phenyl)-isophthalic acid and 2-(1-ethynyl-phenyl)-terephthalic acid;
phenylethynylphthalic acid such as 3-phenylethynylphthalic acid, 5-phenylethynylisophthalic acid, 2-phenylethynyl-terephthalic acid, and 3-phenylethynylterephthalic acid;
phenylethynyl-napthalenedicarboxylic acid such as 2-phenylethynyl-1,5-napthalenedicarboxylic acid and diphenylethynyl-biphenyldicarboxylic acid such as 3,3'-diphenylethynyl-2,2'-biphenyldicarboxylic acid;
bis(carboxy-phenylethynylphenyl)propane such as 2,2-bis (2-carboxy-3-phenylethynylphenyl)propane;
bis(carboxy-phenylethynylphenyl)hexafluoropropane such as 2,2-bis(2-carboxy-4-phenylethynylphenyl)hexafluoropropane;
phenylethynyl-phenoxyphthalic acid such as 5-(1-phenylethynyl-phenoxy)-isophthalic acid, 5-(2-phenylethynyl-phenoxy)-isophthalic acid, 5-(3-phenylethynyl-phenoxy)-isophthalic acid, and 2-(1-phenylethynyl-phenoxy)-terephthalic acid;
dicarboxylic acids having an acetylene skeleton in the molecule such as trans-dicarboxylic acids such as 4,4'-trans-dicarboxylic acid and 3,4'-trans-dicarboxylic acid;
dicarboxylic acids having a biphenylene skeleton such as 1,2-biphenylenedicarboxylic acid and 1,3-biphenylenedicarboxylic acid; and the like can be given. These compounds may be used either individually or in combination of two or more.

Of these compounds, one or more dicarboxylic acids selected from ethynylphthalic acid, phenylethynylphthalic acid, and (phenylethynyl-phenoxy)-phthalic acid are preferable. This allows a crosslinking reaction to occur in a three-dimensional network by heating the polybenzoxazole resin, whereby the heat resistance of the resulting polybenzoxazole resin can be further improved.

2.2.2.3. Endcapping Compound

In the invention, in order to improve the storage stability of polybenzoxazole and polybenzoxazole varnish, an endcapping compound may be caused to react with the terminal of the polybenzoxazole resin when synthesizing the polybenzoxazole resin to endcap the polybenzoxazole resin.

As examples of the endcapping compound, phthalic anhydrides such as phthalic anhydride, 3-ethynyl-phthalic anhydride, and 3-phenylethynyl-phthalic anhydride, acid anhydrides such as maleic anhydride and 5-norbornene-2,3-dicarboxylic anhydride, aniline compounds such as aniline, 4-ethynylaniline, 3-ethynylaniline, 4-phenylethynylaniline, and 3-phenylethynylaniline, aminophenol compounds such as 2-aminophenol, 2-amino-5-ethynylphenol, and 2-amino-5-phenylethynylphenol, and the like can be given. These compounds may be used either individually or in combination of two or more.

Of these compounds, compounds having a crosslinking group such as a carbon-carbon double bond or a carbon-carbon triple bond are preferable. This allows a crosslinking reaction to occur in a three-dimensional network by heating the polybenzoxazole resin, whereby the heat resistance of the resulting polybenzoxazole resin can be improved.

2.2.3. Preparation of Polybenzoxazole Resin

The polybenzoxazole resin used in the invention is obtained by subjecting a polybenzoxazole resin precursor, which is obtained from the bisaminophenol compound and the dicarboxylic acid compound using a synthesis method such as an acid chloride method, an active ester method, or condensation in the presence of a dehydration condensing agent such as polyphosphoric acid or dicyclohexylcarbodiimide, to cyclization reaction. As the method of subjecting the polybenzoxazole resin precursor to cyclization reaction, a method of heating the polybenzoxazole resin precursor at 150 to 450° C. for 5 minutes to 24 hours, a method of applying ultraviolet rays to the polybenzoxazole resin precursor, a method of applying electron beams to the polybenzoxazole resin precursor, and the like can be given.

As an example of the method of producing the polybenzoxazole resin precursor used in the invention utilizing an acid chloride method, the dicarboxylic acid compound such as isophthalic acid and excess thionyl chloride are reacted at room temperature to 75° C. in the presence of a catalyst such as N,N-dimethylformamide. After evaporating the excess thionyl chloride by heating under reduced pressure, the residue is recrystallized from a solvent such as hexane to obtain isophthalic acid chloride which is an acid chloride of the dicarboxylic acid compound.

The bisaminophenol compound such as 2,2-bis(3-amino-4-hydroxyphenyl)propane is dissolved in a polar solvent such as N-methyl-2-pyrrolidone or N,N-dimethylacetamide. The chloride compound of the dicarboxylic acid compound prepared in advance is reacted with the bisaminophenol compound at room temperature to −30° C. in the presence of an acid acceptor such as triethylamine to obtain a solution of the polybenzoxazole resin precursor. The solution is subjected to reprecipitation in a poor solvent such as water to obtain a polybenzoxazole resin precursor.

In order to improve storage stability or the like, the above-mentioned endcapping compound may be caused to react with the terminal of the resulting polybenzoxazole resin precursor to endcap the polybenzoxazole resin precursor.

As an example of the endcapping method for the polybenzoxazole used in the invention, the endcapping compound such as 5-norbornene-2,3-dicarboxylic anhydride is added to the solution of the polybenzoxazole resin precursor obtained as described above, and reacted with the polybenzoxazole resin precursor at room temperature to 150° C. to obtain a polybenzoxazole resin of which the terminal is endcapped.

The polybenzoxazole resin precursor may also be obtained by reacting an active ester compound of the dicarboxylic acid compound with the bisaminophenol compound instead of the acid chloride compound.

Additives such as a surfactant and a coupling agent may be added to the polybenzoxazole used in the invention, as required.

2.2.4. Method of Forming Protective Film

In the invention, the protective film is formed as follows. For example, the polybenzoxazole resin precursor is dissolved in an appropriate organic solvent to prepare a varnish. The varnish is applied to a substrate (the wiring layer 20 in the laminate according to this embodiment) to form a coating. As the coating method, spin coating using a spinner, spray coating using a spray coater, immersion, printing, roll coating, coating using a roller blade, and the like can be given. A coating with a dry thickness of about 5 to 10,000 nm may be formed by single application. The resulting coating is subjected to cyclization reaction by heating at 400° C. for one hour to obtain a protective film formed of a polybenzoxazole resin film, for example.

As examples of the organic solvent, N-methyl-2-pyrrolidone, gamma-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxypropionate, cyclohexanone, and the like can be given. These organic solvents may be used either individually or in combination of two or more.

2.3. Second Insulating Layer

2.3.1. Silica Film

The silica film, which is one of the insulating layers forming the second insulating layer, is formed using a film-forming composition including a hydrolysis-condensation product obtained by hydrolyzing and condensing at least one compound selected from the group consisting of compounds of the following general formulas (7) to (10).

$$HSi(OR^1)_3 \quad (7)$$

wherein $R^1$ represents a monovalent organic group.

$$R_a Si(OR^2)_{4-a} \quad (8)$$

wherein R represents a fluorine atom or a monovalent organic group, $R^2$ represents a monovalent organic group, and a represents an integer of 1 or 2.

$$Si(OR^3)_4 \quad (9)$$

wherein $R^3$ represents a monovalent organic group.

$$R^4{}_b(R^5O)_{3-b}Si-(R^8)_d-Si(OR^6)_{3-c}R^7{}_c \quad (10)$$

wherein $R^4$ to $R^7$ individually represent monovalent organic groups, b and c individually represent integers from 0 to 2, $R^8$ represents an oxygen atom, a phenylene group, or a group —$(CH_2)_n$— (wherein n represents an integer from 1 to 6), and d represents 0 or 1.

The film-forming composition for the silica film is described below. The film-forming composition for the silica film according to this embodiment includes a hydrolysis-condensation product obtained by hydrolyzing and condensing at least one compound selected from the group consisting of a compound of the general formula (7) (hereinafter called "compound 7"), a compound of the general formula (8) (hereinafter called "compound 8"), a compound of the general formula (9) (hereinafter called "compound 9"), and a compound of the general formula (10) (hereinafter called "compound 10"). The compounds for forming the film-forming composition are described below.

2.3.1.1. Compound 7

As examples of the monovalent organic group represented by $R^1$ in the general formula (7), an alkyl group, an aryl group, an allyl group, a glycidyl group, and the like can be given. In the general formula (7), $R^1$ is preferably a monovalent organic group, and particularly preferably an alkyl group or a phenyl group. As examples of the alkyl group, a methyl group, an ethyl group, a propyl group, a butyl group, and the like can be given. The alkyl group preferably has 1 to 5 carbon atoms. These alkyl groups may be either linear or branched, in which a hydrogen atom may be replaced with a fluorine atom or the like. As examples of the aryl group in the general formula (7), a phenyl group, a naphthyl group, a methylphenyl group, an ethylphenyl group, a chlorophenyl group, a bromophenyl group, a fluorophenyl group, and the like can be given.

As specific examples of the compound 7, compounds disclosed in JP-A-2001-354904 can be given.

As compounds particularly preferable as the compound 7, trimethoxysilane, triethoxysilane, tri-n-propoxysilane, triisopropoxysilane, tri-n-butoxysilane, tri-sec-butoxysilane, tri-tert-butoxysilane, triphenoxysilane, and the like can be given.

2.3.1.2. Compound 8

As examples of the monovalent organic groups represented by R and $R^2$ in the general formula (8), the organic groups given as examples for the general formula (5) can be given.

As specific examples of the compound 8, compounds disclosed in JP-A-2001-354904 can be given.

As compounds particularly preferable as the compound 8, methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, divinyldimethoxysilane, divinyldiethoxysilane, diphenyldimethoxysilane, diphenyldiethoxysilane, and the like can be given.

2.3.1.3. Compound 9

As examples of the monovalent organic group represented by $R^3$ in the general formula (9), the organic groups given as examples for the general formula (5) can be given.

As specific examples of the compound 9, compounds disclosed in JP-A-2001-354904 can be given.

As compounds preferable as the compound 9, tetramethoxysilane, tetraethoxysilane, tetra-n-propoxysilane, tetra-iso-propoxysilane, tetra-n-butoxysilane, tetra-sec-butoxysilane, tetra-t-butoxysilane, tetraphenoxysilane, and the like can be given. Of these, tetramethoxysilane and tetraethoxysilane are particularly preferable. These compounds may be used either individually or in combination of two or more.

2.3.1.4. Compound 10

As examples of the monovalent organic groups represented by $R^4 R^7$ in the general formula (10), the organic groups given as examples for the general formula (7) can be given.

As specific examples of the compound 10, compounds disclosed in JP-A-2001-354904 can be given.

As preferable examples of the compound 10 in which $R^8$ in the general formula (10) is an oxygen atom, hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, 1,3-diethoxy-1,1,3,3-tetraphenyldisiloxane, and the like can be given.

As preferable examples of the compound in which d=0 in the general formula (10), hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like can be given.

As preferable examples of the compound in which $R^8$ in the general formula (10) is the group $—(CH_2)_n—$, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like can be given.

The compounds 7 to 10 may be used either individually or in combination of two or more.

2.3.1.5. Preparation of Film-Forming Composition

The film-forming composition for the silica film is prepared by hydrolyzing and condensing at least one compound selected from the group consisting of the compounds 7 to 10. It is preferable to use a catalyst during hydrolysis and condensation. As examples of the catalyst, a metal chelate compound, an organic acid, an inorganic acid, an organic base, and an inorganic base can be given.

As specific examples of the metal chelate compound, metal chelate compounds disclosed in JP-A-2001-335748 can be given.

As examples of the organic acid, the following compounds can be given.

Examples of the organic acid include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, and the like. As examples of the inorganic acid, hydrochloric acid, nitric acid, sulfuric acid, hydrofluoric acid, phosphoric acid, and the like can be given.

As examples of the organic base, the following compounds can be given.

Examples of the organic base include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, urea, creatinine, and the like. As examples of the inorganic base, ammonia, sodium hydroxide, potassium hydroxide, barium hydroxide, calcium hydroxide, and the like can be given.

Of these catalysts, the metal chelate compound, the organic acid, and the inorganic acid are preferable, with the organic acid being more preferable. As the organic acid, acetic acid, oxalic acid, maleic acid, and malonic acid are particularly preferable. When using the organic acid as the catalyst, precipitation and gelation of the polymer rarely occur during hydrolysis and condensation. These catalysts may be used either individually or in combination of two or more. The catalyst is used in an amount of usually 0.00001 to 0.5 mol, and preferably 0.00001 to 0.1 mol for one mol of the total amount of $R^X O$ groups (X=1 to 3, 5, 6) in the compounds 1 to 4. The molecular weight of the condensate formed of the compound selected from the compounds 1 to 4 is usually 500 to 3,000,000, preferably 700 to 2,000,000, and still more preferably about 1000 to 1,000,000.

In the film-forming composition for the silica film according to the invention, the hydrolysis-condensation product of the above silane compound is dissolved or dispersed in an organic solvent.

As examples of the organic solvent, at least one solvent selected from the group consisting of alcohol solvents, ketone solvents, amide solvents, ester solvents, and nonprotic solvents can be given. As examples of these solvents, alcohol solvents, ketone solvents, amide solvents, ester solvents, and nonprotic solvents disclosed in JP-A-2002-20689 can be given. The alcohol solvent is preferable as the organic solvent.

The film-forming composition according to the invention may further include components such as colloidal silica, colloidal alumina, a surfactant, and a silane coupling agent.

2.3.1.6. Method of Forming Silica Film

A method of forming the silica film is described below.

The method of forming the silica film includes applying the above film-forming composition to a substrate (protective layer 30 in the laminate according to this embodiment), and heating the applied composition. As the method of applying the composition to the substrate, spin coating, dipping, coating using a roller blade, spraying, and the like can be given. A coating with a dry thickness of about 5 to 1500 nm is obtained by single application, and a coating with a dry thickness of about 10 to 3000 nm is obtained by double application.

The coating may be dried by heating at about 60 to 600° C. for about 1 to 240 minutes, for example. As the heating method, a hot plate, an oven, a furnace, or the like may be used. The coating may be heated in air, nitrogen, or argon, under vacuum, or under reduced pressure in which the oxygen concentration is controlled. When curing the coating, the coating is heated at preferably 80 to 450° C., and still more preferably 200 to 420° C. in an inert atmosphere or under reduced pressure. The coating may also be formed by applying electron beams or ultraviolet rays. In this case, the drying time can be reduced.

2.3.2. Organic Film

The organic film used as one of the layers forming the second insulating layer is preferably an organic film with a relative dielectric constant of 3 or less. A wiring delay can be reduced by using an insulating layer with a relative dielectric constant of 3 or less, whereby the operation speed can be increased.

The organic film is formed of a resin such as polybenzoxazole, polyarylene, polyarylene ether, polyimide, or polyamide. In particular, polybenzoxazole is preferable due to its low dielectric constant, high density, and high glass transition temperature.

As examples of these resins, resins disclosed in JP-A-5-205526, JP-A-2000-191752, JP-A-11-228674, JP-A-11-349683, and the like can be given.

Additives such as a surfactant and a coupling agent may be added to the organic film, as required.

The dielectric constant of the organic film may be reduced by using a film in which pores are introduced, as required. The method of introducing the pores is not particularly limited. For example, a porogen method can be given in which a coating is formed in a state in which porogens as the pore source are dispersed in the film, and only the porogens are removed by utilizing energy such as heat to introduce pores. As examples of such a method, methods disclosed in JP-A-5-205526, JP-A-2000-31137, JP-A-2002-167442, and the like can be given.

2.4. Hard Mask Layer

As the hard mask layer 50, at least one of a silica film and an organic film may be used. The above-described silica film and organic film may be used as the hard mask layer 50.

3. Semiconductor Device

Figure 4:
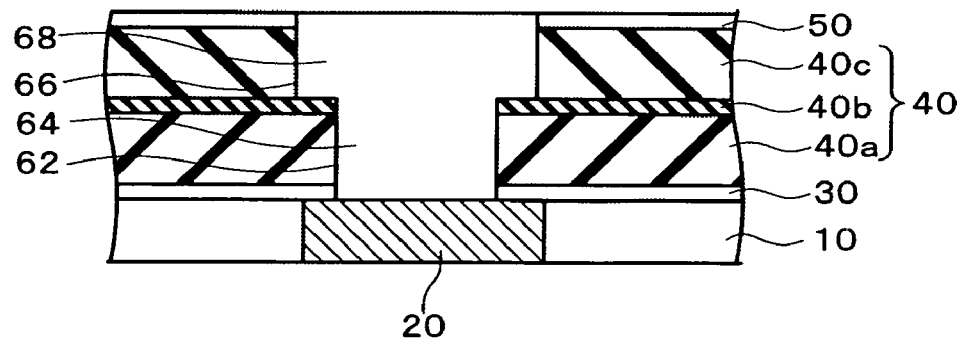
FIG. 4 is a cross-sectional view schematically showing a semiconductor device according to one embodiment of the invention.

A semiconductor device in which a wiring layer is formed in the second insulating layer 40 of the laminate described in "1. Laminate" using a dual damascene method is described below. FIG. 4 is a cross-sectional view schematically showing a semiconductor device according to this embodiment. This embodiment illustrates an example using the laminate according to the third example.

As shown in FIG. 4, the semiconductor device according to this embodiment includes the first insulating layer 10 and the wiring layer 20 with a specific pattern. The protective layer 30 formed of the polybenzoxazole resin layer is provided on the wiring layer 20. The second insulating layer 40 is provided on the protective layer 30. The second insulating layer 40 is formed by stacking the insulating layers 40a, 40b, and 40c in that order. The insulating layers 40a and 40c may be insulating layers formed of the same material. A silica film or an organic film is used as the insulating layers 40a and 40c, for example. The insulating layer 40b formed of a material differing from the materials for the insulating layers 40a and 40c is provided between the insulating layers 40a and 40c. A silica film or an organic film may be used as the material for the insulating layer 40b.

A via opening 62 is formed in insulating layers 40a and 40b. A wiring opening 66 continuous with the via opening 62 is formed in the insulating layer 40c. A via layer 64 and a wiring layer 68 are provided which are formed by providing a conductive layer in the via opening 62 and the wiring opening 66. The wiring layer 20 and the wiring layer 68 are electrically connected through the via layer 64.

An example of a method of forming the semiconductor device shown in FIG. 4 is described below.

(1) As shown in FIG. 3, the wiring layer 20 with a specific pattern is formed in the first insulating layer 10. The wiring layer 20 is formed of a material containing copper. The wiring layer 20 may be formed using a known method. The protective layer 30 which covers at least the upper surface of the wiring layer 20 is formed. The protective layer 30 is a polybenzoxazole resin layer. The protective layer 30 is formed by applying the above-described film-forming composition to the wiring layer 20 and the first insulating layer 10 to form a coating, and curing the coating. The details of the film-forming composition and the curing treatment are described in "2.2. Protective layer".

(2) The second insulating layer 40, in which a dual damascene structure is formed, is provided on the protective layer 30. In the manufacturing method according to this embodiment using the laminate according to the third example, the second insulating layer 40 is formed by stacking the insulating layer 40a formed of a silica film, the insulating layer 40b formed of an organic film, and the insulating layer 40c formed of a silica film in that order. The silica films 40a and 40c are formed by forming a coating using the film-forming composition described in "2.3.1. Silica film", and curing the coating. The organic film 40b is formed by forming a coating using the film-forming composition described in "2.3.2. Organic film", and curing the coating in the same manner as the silica films 40a and 40c. The hard mask layer 50 is formed on the second insulating layer 40, as required. After forming the conductive layer in the via opening 62 and the wiring opening 66 formed in the second insulating layer 40, the conductive layer formed on the second insulating layer 40 is removed by CMP or the like. It suffices that the hard mask layer 50 serve as an etching stopper layer in the CMP step. A silica film or an organic film may be used as the hard mask layer 50.

(3) The wiring opening 66 and the via opening 62 continuous with the wiring opening 66 are formed by removing part of the second insulating layer 40. The conductive layer is provided in the wiring opening 66 and the via opening 62 so that the wiring layer having a dual damascene structure which is electrically connected with the wiring layer 20 is formed.

A first mask layer (not shown) having an opening in the region in which the via opening 62 is formed is provided on the hard mask layer 50. The insulating layer 40c is etched using the first mask layer as a mask until the insulating layer 40b is exposed. The insulating layer 40b is then etched until the insulating layer 40a is exposed. A second mask layer (not shown) having an opening in the region in which the wiring opening 66 is formed is provided on the hard mask layer 50. The second mask layer has an opening pattern larger than that of the first mask layer. The exposed insulating layer 40c and insulating layer 40a are removed using the second mask layer as a mask. The wiring opening 66 and the via opening 62 continuous with the wiring opening 66 are thus formed on the wiring layer 20.

The protective layer 30 located under the via opening 62 is removed by etching before providing the conductive layer in the subsequent step. The protective layer 30 located under the via opening 62 may be removed when forming the via opening 62 or after forming the via opening 62.

The conductive layer is then provided in the via opening 62 and the wiring opening 66. As the material for the conductive layer, the conductive material given as an example for the wiring layer may be used. In particular, it is preferable to use a conductive material containing copper since a wiring delay can be reduced due to low resistance. After providing the conductive layer, planarization treatment such as CMP is performed, whereby the via layer 64 is formed in the via opening 62 and the wiring layer 68 is formed in the wiring opening 66. The wiring layer 68 and the wiring layer 20 are electrically connected through the via layer 64.

The wiring layer to which the dual damascene structure is applied can be formed in the laminate according to this embodiment by the above steps.

In the semiconductor device according to this embodiment, since the protective layer 30 is provided on the wiring layer 20, diffusion of copper into the second insulating layer 40 can be reduced. This allows the second insulating layer 40 to exhibit a sufficient dielectric breakdown resistance, whereby a highly reliable semiconductor device can be provided.

The following advantage is obtained when using the laminate according to the third example. When forming a wiring layer using the dual damascene method, etching may be performed a number of times using mask layers with different patterns, as described above. In the first etching, the second insulating layer 40 is removed to a desired depth using the first mask layer having an opening in the region in which the via opening 62 is formed. In the second etching, the wiring opening 66 and the via opening 62 are formed using the second mask layer having an opening larger than that of the first mask layer (mask layer having an opening in the region in which the wiring opening 66 is formed). In order to prevent the insulating layer 40a from being etched to a large extent during the second etching, it is preferable that the insulating layer 40c and the insulating layer 40b differ in etching rate. In the laminate according to the third example, since the second insulating layer 40 is formed of a plurality of layers of different materials, each insulating layer differs in etching rate. This allows the insulating layer 40b to serve as an etching stopper layer during the second etching, whereby a wiring opening 66 with an excellent shape can be formed.

The invention is not limited to the above embodiment. Various modifications and variation may be made within the spirit and scope of the invention. When forming a wiring layer in the second insulating layer 40 of the laminate according to the first example or the second example using the dual damascene method, the wiring opening 66 and the via opening 62 may be formed while controlling the conditions for the first etching and the second etching (e.g. treatment time and etching gas). The laminate according to the first example may also be applied to a semiconductor device in which a normal contact layer is formed in the second insulating layer 40 without applying the dual damascene structure.

4. EXAMPLE

The invention is described below in more detail by way of examples. Note that the following description generally illustrates the aspects of the invention. The invention should not be unduly limited to the following description. In the examples and comparative example, "part" and "%" respectively refer to "part by weight" and "wt %" unless otherwise indicated. Various evaluations were carried out as follows.

4.1. Evaluation Method (Evaluation of Relative Dielectric Constant)

A composition sample was applied to an 8-inch silicon wafer by spin coating. The substrate was dried at 80° C. for one minute on a hot plate and at 200° C. for one minute in a nitrogen atmosphere. The substrate was then sintered at 420° C. for 60 minutes on a hot plate in a nitrogen atmosphere. An aluminum electrode pattern was formed on the resulting film by deposition to prepare a relative dielectric constant measurement sample. The relative dielectric constant of the coating (sample) was measured by a CV method at a frequency of 100 kHz using an electrode "HP16451B" and a precision LCR meter "HP4284A" manufactured by Yokogawa-Hewlett-Packard Co., Ltd.

(Evaluation of Dielectric Breakdown Resistance)

An aluminum electrode pattern was formed on the resulting laminate by deposition to prepare a dielectric breakdown voltage measurement sample. The dielectric breakdown voltage of the coating was measured by an IV method using an electrode "HP16451B" and a precision LCR meter "HP4284A" manufactured by Yokogawa-Hewlett-Packard Co., Ltd.

4.2. Preparation of Film-Forming Composition

4.2.1. Preparation of Polybenzoxazole Resin Precursor (Protective Film)

(Preparation Example 1 of Protective Film)

2.16 parts (10 mmol) of 3,3'-diamino-4,4'-dihydroxy-biphenyl was dissolved in 40 parts of dry N-methyl-2-pyrrolidone in a dry nitrogen atmosphere. 1.94 parts (9.5 mmol) of isophthalic acid dichloride was slowly added to the solution at 5° C. over 30 minutes. After allowing the mixture to warm to room temperature, the mixture was stirred at room temperature for one hour. 2.45 parts (22 mmol) of triethylamine was added dropwise to the mixture at 5° C. over 30 minutes. After the addition, the mixture was allowed to warm to room temperature and reacted at room temperature for three hours with stirring to obtain a polybenzoxazole resin precursor. The polystyrene-reduced number average molecular weight (Mn) of the resulting polybenzoxazole resin precursor was measured using a GPC manufactured by Tosoh Corp. and found to be $7.5 \times 10^3$. The weight average molecular weight (Mw) of the polybenzoxazole resin precursor was $1.8 \times 10^4$.

10 g of the polybenzoxazole resin precursor was dissolved in N-methyl-2-pyrrolidone to prepare a 5 wt % solution. The solution was filtered through a Teflon (registered trademark) filter with a pore size of 0.2 micrometers to obtain a polybenzoxazole precursor varnish (A-1). A film was formed using the resulting varnish. The relative dielectric constant of the film was measured and found to be 2.9.

(Preparation Example 2 of Protective Film)

A polybenzoxazole resin precursor was synthesized in the same manner as in Preparation Example 1 except for using 2.32 parts (10 mmol) of 3,3'-diamino-4,4'-dihydroxy-diphenyl ether instead of 2.16 parts (10 mmol) of 3,3'-diamino-4,4'-dihydroxy-biphenyl and using 1.94 parts (9.5 mmol) of terephthalic acid dichloride instead of 1.94 parts (9.5 mmol) of isophthalic acid dichloride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $2.1 \times 10^3$ and $8.1 \times 10^4$. The polybenzoxazole resin precursor was treated in the same manner as in Preparation Example 1 to obtain a polybenzoxazole precursor varnish (A-2). A film was formed using the resulting varnish. The relative dielectric constant of the film was measured and found to be 3.0.

(Preparation Example 3 of Protective Film)

A polybenzoxazole resin precursor was synthesized in the same manner as in Preparation Example 1 except for using 5.652 parts (10 mmol) of 9,9-bis(4-(4-amino-3-hydroxy)-phenoxy-phenyl)fluorene instead of 2.16 parts (10 mmol) of 3,3'-diamino-4,4'-dihydroxy-biphenyl and using 2.40 parts (9.5 mmol) of 1,4-napthalenedicarboxylic acid dichloride instead of 1.94 parts (9.5 mmol) of isophthalic acid dichloride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $5.0 \times 10^3$ and $1.5 \times 10^4$. The polybenzoxazole resin precursor was treated in the same manner as in Preparation Example 1 to obtain a polybenzoxazole precursor varnish (A-3). A film was formed using the resulting varnish. The relative dielectric constant of the film was measured and found to be 3.0.

(Preparation Example 4 of Protective Film)

3.80 parts (10 mmol) of 9,9-bis(3-amino-4-hydroxy-phenyl)fluorene was dissolved in 40 parts of dry N-methyl-2-pyrrolidone in a dry nitrogen atmosphere. 2.80 parts (9.5 mmol) of 4,4'-oxybisbenzoic acid dichloride was slowly added to the solution at 5° C. over 30 minutes. After allowing the mixture to warm to room temperature, the mixture was stirred at room temperature for one hour. 2.45 parts (22 mmol) of triethylamine was added dropwise to the mixture at 5° C. over 30 minutes. After the addition, the mixture was allowed to warm to room temperature and reacted at room temperature for three hours with stirring. Then, 0.16 parts (0.1 mmol) of 5-norbornene-2,3-dicarboxylic anhydride was added to the mixture at 5° C. After the addition, the mixture was allowed to warm to room temperature and reacted at room temperature for three hours with stirring to obtain a polybenzoxazole resin precursor. The polystyrene-reduced number average molecular weight (Mn) of the resulting polybenzoxazole resin precursor was measured using a GPC manufactured by Tosoh Corp. and found to be $8.5 \times 10^3$. The weight average molecular weight (Mw) of the polybenzoxazole resin precursor was $2.5 \times 10^4$.

10 g of the polybenzoxazole resin precursor was dissolved in N-methyl-2-pyrrolidone to prepare a 5 wt % solution. The solution was filtered through a Teflon (registered trademark) filter with a pore size of 0.2 micrometers to obtain a polybenzoxazole precursor varnish (A-4). A film was formed using the resulting varnish. The relative dielectric constant of the film was measured and found to be 3.0.

(Preparation Example 5 of Protective Film)

A polybenzoxazole resin precursor was synthesized in the same manner as in Preparation Example 4 except for using 2.16 parts (10 mmol) of 3,3'-diamino-4,4'-dihydroxy-biphenyl instead of 3.80 parts (10 mmol) of 9,9-bis(3-amino-4-hydroxy-phenyl)fluorene and using 0.97 parts (4.75 mmol) of isophthalic acid dichloride and 1.44 parts (4.75 mmol) of 5-phenylethynylisophthalic acid dichloride instead of 2.80 parts (9.5 mmol) of 4,4'-oxybisbenzoic acid dichloride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $7.2 \times 10^3$ and $2.3 \times 10^4$. The polybenzoxazole resin precursor was treated in the same manner as in Preparation Example 4 to obtain a polybenzoxazole precursor varnish (A-5). A film was formed using the resulting varnish. The relative dielectric constant of the film was measured and found to be 3.0.

(Preparation Example 6 of Protective Film)

A polybenzoxazole resin precursor was synthesized in the same manner as in Preparation Example 4 except for using 2.16 parts (10 mmol) of 3,3'-diamino-4,4'-dihydroxy-biphenyl instead of 3.80 parts (10 mmol) of 9,9-bis(3-amino-4-hydroxy-phenyl)fluorene, using 0.97 parts (4.75 mmol) of terephthalic acid dichloride and 1.08 parts (4.75mmol) of 5-ethynylisophthalic acid dichloride instead of 2.80 parts (9.5 mmol) of 4,4'-oxybisbenzoic acid dichloride, and using 0.17 parts (0.1 mmol) of 5-ethynylphthalic anhydride instead of 0.16 parts (0.1 mmol) of 5-norbornene-2,3-dicarboxylic anhydride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $7.0 \times 10^3$ and $2.2 \times 10^4$. The polybenzoxazole resin precursor was treated in the same manner as in Preparation Example 4 to obtain a polybenzoxazole precursor varnish (A-6). A film was formed using the resulting varnish. The relative dielectric constant of the film was measured and found to be 3.0.

(Preparation Example 7 of Protective Film)

A polybenzoxazole resin precursor was synthesized in the same manner as in Preparation Example 4 except for using 1.40 parts (4.75 mmol) of 4,4'-oxybisbenzoic acid dichloride and 1.44 parts (4.75 mmol) of 5-phenylethynylisophthalic acid dichloride instead of 2.80 parts (9.5 mmol) of 4,4'-oxybisbenzoic acid dichloride and using .25parts (0.1 mmol) of 5-phenylethynylphthalic anhydride instead of 0.16 parts (1.0 mol) of 5-norbornene-2,3-dicarboxylic anhydride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $8.4 \times 10^3$ and $2.4 \times 10^4$. The polybenzoxazole resin precursor was treated in the same manner as in Preparation Example 4 to obtain a polybenzoxazole precursor varnish (A-7). A film was formed using the resulting varnish. The relative dielectric constant of the film was measured and found to be 3.0.

(Preparation Example 8 of Protective Film)

A polybenzoxazole resin precursor was synthesized in the same manner as in Preparation Example 4 except for using 5.80 parts (10 mmol) of 9,9-bis(3-amino-hydroxy-phenyl)-2,7-bisphenylethynylfluorene instead of 3.80 parts (10 mmol) of 9,9-bis(3-amino-4-hydroxy-phenyl)fluorene, using 0.97 parts (4.75 mmol) of isophthalic acid dichloride and 1.44 parts (4.75 mmol) of 5-phenylethynylisophthalic acid dichloride instead of 2.80 parts (9.5 mmol) of 4,4'-oxybisbenzoic acid dichloride, and using 0.25 parts (1.0 mmol) of 5-phenylethynylphthalic anhydride instead of 0.16 parts (1.0 mmol) of 5-norbornene-2,3-dicarboxylic anhydride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $6.2 \times 10^3$ and $1.9 \times 10^4$. The polybenzoxazole resin precursor was treated in the same manner as in Preparation Example 4 to obtain a polybenzoxazole precursor varnish (A-8). A film was formed using the resulting varnish. The relative dielectric constant of the film was measured and found to be 3.0.

(Preparation Example 9 of Protective Film)

A polybenzoxazole resin precursor was synthesized in the same manner as in Preparation Example 4 except for using 2.0 parts (6.7 mmol) of 4,4'-oxybisbenzoic acid dichloride and 0.86 parts (2.9 mmol) of 5-phenylethynylisophthalic acid dichloride instead of 2.8 parts (9.5 mmol) of 4,4'-oxybisbenzoic acid dichloride and using 0.25 parts (1.0 mmol) of 5-phenylethynylphthalic anhydride instead of 0.16 parts (0.1 mmol) of 5-norbornene-2,3-dicarboxylic anhydride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $7.5 \times 10^3$ and $2.1 \times 10^4$. The polybenzoxazole resin precursor was treated in the same manner as in Preparation Example 4 to obtain a polybenzoxazole precursor varnish (A-9). A film was formed using the resulting varnish. The relative dielectric constant of the film was measured and found to be 3.0.

(Preparation Example 10 of Protective Film)

A polybenzoxazole resin precursor was synthesized in the same manner as in Preparation Example 4 except for using 0.84 parts (2.9 mmol) of 4,4'-oxybisbenzoic acid dichloride and 2.0 parts (6.7 mmol) of 5-phenylethynylisophthalic acid dichloride instead of 2.8 parts (9.5 mmol) of 4,4'-oxybisbenzoic acid dichloride and using 0.25 parts (1.0 mmol) of 5-phenylethynylphthalic anhydride instead of 0.16 parts (0.1 mmol) of 5-norbornene-2,3-dicarboxylic anhydride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $6.8 \times 10^3$ and $2.0 \times 10^4$. The polybenzoxazole resin precursor was treated in the same manner as in Preparation Example 4 to obtain a polybenzoxazole precursor varnish (A-10). A film was formed using the resulting varnish. The relative dielectric constant of the film was measured and found to be 3.0.

(Preparation Example 11 of Protective Film)

A polybenzoxazole resin precursor was synthesized in the same manner as in Preparation Example 4 except for using 2.9 parts (9.5 mmol) of 5-phenylethynylisophthalic acid dichloride instead of 2.8 parts (9.5 mmol) of 4,4'-oxybisbenzoic acid dichloride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $6.5 \times 10^3$ and $1.7 \times 10^4$. The polybenzoxazole resin precursor was treated in the same manner as in Preparation Example 4 to obtain a polybenzoxazole precursor varnish (A-11). A film was formed using the resulting varnish. The relative dielectric constant of the film was measured and found to be 2.9.

(Preparation Example 12 of Protective Film)

A polybenzoxazole resin precursor was synthesized in the same manner as in Preparation Example 4 except for using 2.7 parts (9.0 mmol) of 4,4'-oxybisbenzoic acid dichloride instead of 2.8 parts (9.5 mmol) of 4,4'-oxybisbenzoic acid dichloride and using 0.50 parts (2.0 mmol) of 5-phenylethynylphthalic anhydride instead of 0.16 parts (0.1 mmol) of 5-norbornene-2,3-dicarboxylic anhydride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $6.3 \times 10^3$ and $0.5 \times 10^4$.

The polybenzoxazole resin precursor was treated in the same manner as in Preparation Example 4 to obtain a polybenzoxazole precursor varnish (A-12). A film was formed using the resulting varnish. The relative dielectric constant of the film was measured and found to be 3.0.

(Preparation Example 13 of Protective Film)

A polybenzoxazole resin precursor was synthesized in the same manner as in Preparation Example 4 except for using 2.2 parts (10 mmol) of 3,3'-diamino-4,4'-dihydroxy-biphenyl instead of 3.8 parts (10 mmol) of 9,9-bis(3-amino-4-hydroxyphenyl)fluorene, using 1.4 parts (6.7 mmol) of isophthalic acid dichloride and 0.86 parts (2.9 mmol) of 5-phenylethynylisophthalic acid dichloride instead of 2.8 parts (9.5 mmol) of 4,4'-oxybisbenzoic acid dichloride, and using 0.25 parts (0.11 mmol) of 5-phenylethynylphthalic anhydride instead of 0.16 parts (0.1 mmol) of 5-norbornene-2,3-dicarboxylic anhydride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $7.4 \times 10^3$ and 2.2×

$10^4$. The polybenzoxazole resin precursor was treated in the same manner as in Preparation Example 4 to obtain a polybenzoxazole precursor varnish (A-13). A film was formed using the resulting varnish. The relative dielectric constant of the film was measured and found to be 3.0.

(Preparation Example 14 of Protective Film)

A polybenzoxazole resin precursor was synthesized in the same manner as in Preparation Example 4 except for using 1.9 parts (6.3 mmol) of 4,4'-oxybisbenzoic acid dichloride and 0.64 parts (2.1 mmol) of 5-phenylethynylisophthalic acid dichloride instead of 2.8 parts (9.5 mmol) of 4,4'-oxybisbenzoic acid dichloride and using 0.50 parts (2.0 mmol) of 5-phenylethynylphthalic anhydride instead of 0.16 parts (0.1 mmol) of 5-norbornene-2,3-dicarboxylic anhydride. The molecular weight of the resulting polybenzoxazole resin precursor was measured using a GPC. The polystyrene-reduced number average molecular weight (Mn) and weight average molecular weight (Mw) of the polybenzoxazole resin precursor were respectively $6.2 \times 10^3$ and $1.5 \times 10^4$. The polybenzoxazole resin precursor was treated in the same manner as in Preparation Example 4 to obtain a polybenzoxazole precursor varnish (A-14). A film was formed using the resulting varnish. The relative dielectric constant of the film was measured and found to be 3.0.

4.2.2. Preparation of Film-Forming Composition for Silica Film

A separable flask made of quartz was charged with 570 g of distilled ethanol, 160 g of ion-exchanged water, and 30 g of a 10% tetramethylammonium hydroxide aqueous solution. The mixture was uniformly stirred. A mixture of 136 g of methyltrimethoxysilane and 209 g of tetraethoxysilane was added to the solution. The components were allowed to react for five hours while maintaining the solution at 60° C. After the addition of 300 g of propylene glycol monopropyl ether to the solution, the mixture was concentrated at 50° C. using an evaporator until the solid content was 20% (as complete hydrolysis-condensation product). Then, 10 g of a 10% propylene glycol monopropyl ether solution of acetic acid was added to the concentrate to obtain a film-forming composition (B-1). The relative dielectric constant was measured using the film-forming composition (B-1) according to the above evaluation method and found to be 2.23.

4.2.3. Preparation of Film-Forming Composition for Silica Film (Hard Mask Layer) A separable flask made of quartz was charged with 470.9 g of distilled ethanol, 206.1 g of ion-exchanged water, and 30.6 g of a 10% potassium hydroxide aqueous solution. The mixture was uniformly stirred. A mixture of 44.9 g of methyltrimethoxysilane and 68.6 g of tetraethoxysilane was added to the solution over 30 minutes. The components were allowed to react for one hour while maintaining the solution at 55° C. After the addition of 240 g of a 20% maleic acid aqueous solution to the solution, the mixture was sufficiently stirred and then cooled to room temperature. After the addition of 400 g of propylene glycol monopropyl ether to the solution, the mixture was concentrated at 50° C. using an evaporator until the solid content was 10% (as complete hydrolysis-condensation product). Then, 10 g of a 10% propylene glycol monopropyl ether solution of maleic acid was added to the concentrate to obtain a film-forming composition (B-2). The relative dielectric constant was measured using the film-forming composition (B-2) according to the above evaluation method and found to be 2.82.

4.2.4. Preparation of Film-Forming Composition for Organic Film (Insulating Film)

(Preparation Example 1 of Organic Film)

34.8 g (0.095 mol) of 2,2-bis(3-amino-4-hydroxyphenyl) hexafluoropropane was dissolved in 330 ml of dry N-methyl-2-pyrrolidone. 30.3 g (0.1 mol) of 5-phenylethynylisophthalic acid dichloride was added to the solution at 10° C. in dry nitrogen. After the addition, the mixture was stirred at 10° C. for one hour and at 20° C. for one hour. After cooling the reaction liquid to 10° C., 22.3 g (0.22 mol) of triethylamine was added to the reaction liquid. A solution prepared by dissolving 40 g of poly(propylene glycol)bis(2-aminopropyl ether) manufactured by Aldrich (0.01 mol, number average molecular weight: 4000) in 100 ml of gamma-butyrolactone was then added to the mixture at 10° C. in dry nitrogen. After the addition, the mixture was stirred at 10° C. for one hour and at 20° C. for 20 hours. After completion of the reaction, the reaction liquid was filtered to remove triethylamine hydrochloride. After the dropwise addition of the filtered liquid to a mixed solution of 6.6 l of ion-exchanged water and 6.6 l of isopropanol, the precipitate was collected and dried to obtain 87.9 g of a polybenzoxazole resin precursor (1). The polystyrene-reduced weight average molecular weight of the resulting polybenzoxazole resin precursor (1) was measured using a GPC manufactured by Tosoh Corp. and found to be 25,000. The molecular weight distribution was 2.20. The introduction rate of the reactive oligomer component determined by $^1$H-NMR was 36 wt %. 10 g of the polybenzoxazole resin precursor (1) was dissolved in N-methyl-2-pyrrolidone to prepare a 5 wt % solution. The solution was filtered through a Teflon (registered trademark) filter with a pore size of 0.2 micrometers to obtain a varnish (C-1). A polybenzoxazole resin film with pores was formed using the resulting varnish. The relative dielectric constant of the polybenzoxazole resin film was measured and found to be 2.2.

(Preparation Example 2 of Organic Film)

19.46 g (0.090 mol) of 3,3'-diamino-4,4'-dihydroxybiphenyl was dissolved in 292 ml of dry N-methyl-2-pyrrolidone. 11.35 g (0.050 mol) of 5-ethynylisophthalic acid dichloride was added to the solution at 5° C. or less in dry nitrogen.

Then, 15.16 g (0.050 mol) of 5-phenylethynylisophthalic acid dichloride was added to the mixture at 5° C. or less in dry nitrogen. After the addition, the mixture was stirred at 10° C. for one hour and at 20° C. for one hour. After cooling the reaction liquid to 5° C. or less, a solution prepared by dissolving 28.80 g of 4-aminobenzoate-terminated styrene oligomer (0.0030 mol, number average molecular weight: 9600) in 100 ml of gamma-butyrolactone was added to the mixture in dry nitrogen. After the addition of 22.26 g (0.22 mol) of triethylamine, the mixture was stirred at 10° C. for one hour and at 20° C. for 20 hours. After completion of the reaction, the reaction liquid was filtered to remove triethylamine hydrochloride. After the dropwise addition of the filtered liquid to a mixed solution of 7 l of ion-exchanged water and 3 l of isopropanol, the precipitate was collected and dried to obtain 60.70 g of a polybenzoxazole resin precursor (2). The polystyrene-reduced weight average molecular weight of the resulting polybenzoxazole resin precursor (2) was measured using a GPC manufactured by Tosoh Corp. and found to be 21,700. The molecular weight distribution was 2.74. The introduction rate of the reactive oligomer component determined by $^1$H-NMR was 38.4 wt %.

5.00 g of the polybenzoxazole resin precursor (2) was dissolved in 20.00 g of N-methyl-2-pyrrolidone. The solution was filtered through a Teflon (registered trademark) filter with a pore size of 0.2 micrometers to obtain a varnish (C-2). A polybenzoxazole resin film with pores was formed using the resulting varnish. The relative dielectric constant of the polybenzoxazole resin film was measured and found to be 2.3.

4.2.5. Preparation of Film-Forming Composition for Organic Film (Hard Mask Layer)

A 1000 ml three-necked flask equipped with a thermometer, an argon gas feed pipe, and a stirrer was charged with 120 ml of tetrahydrofuran, 3.46 g of tetrakistriphenylphosphine palladium, 2.1 g of dichlorobistriphenylphosphine palladium, 1.44 g of copper iodide, 20 ml of piperidine, and 185.72 g of 4,4'-bis(2-iodinephenoxy)benzophenone. After the addition of 65.48 g of 4,4'-diethynyl diphenyl ether, the mixture was allowed to react at 25° C. for 20 hours. After subjecting the reaction liquid to reprecipitation twice using 5 l of acetic acid, the precipitate was dissolved in cyclohexanone, washed twice with ultrapure water, and caused to reprecipitate using 5 l of methanol. The precipitate was filtered and dried to obtain a polymer A with a weight average molecular weight of 35,000.

30 g of the polymer A was dissolved in 270 g of cyclohexanone to obtain a film-forming composition (D). The relative dielectric constant was measured using the film-forming composition (D) according to the above evaluation method and found to be 2.93.

EXAMPLE 1

A CVD film of silane and ammonia was formed on an 8-inch silicon wafer to a thickness of 1000 angstroms using a Sequel Express manufactured by Nevellus. The elemental composition of the coating was Si (50 atomic %), 0 (4 atomic %), C (3 atomic %), N (40 atomic %), and H (4 atomic %). A copper film was stacked on the coating by sputtering to a thickness of 1000 angstroms. After applying the polybenzoxazole film-forming composition (A-1) to the copper film to a thickness of 500 angstroms, the substrate was sintered at 420° C. for 60 minutes on a hot plate in a nitrogen atmosphere. After applying the silica insulating film-forming composition (B-1) to the substrate to a thickness of 4000 angstroms, the substrate was dried at 80° C. for one minute and at 200° C. for one minute. The substrate was then sintered at 420° C. for 60 minutes on a hot plate in a nitrogen atmosphere to form a laminate according to

EXAMPLE 1.

EXAMPLES 2 to 14

In Examples 2 to 14, a laminate according to each example was formed in the same manner as in Example 1 except for changing the polybenzoxazole resin film-forming composition used in Example 1. Table 1 shows the dielectric breakdown voltage of each laminate.

EXAMPLE 15

A CVD film of silane and ammonia was formed on an 8-inch silicon wafer to a thickness of 1000 angstroms using a Sequel Express manufactured by Nevellus. The elemental composition of the coating was Si (50 atomic %), 0 (4 atomic %), C (3 atomic %), N (40 atomic %), and H (4 atomic %). A copper film was stacked on the coating by sputtering to a thickness of 1000 angstroms. After applying the polybenzoxazole film-forming composition (A-1) to the copper film to a thickness of 500 angstroms, the substrate was sintered at 420° C. for 60 minutes on a hot plate in a nitrogen atmosphere. After applying the silica insulating film-forming composition (B-1) to the substrate to a thickness of 2000 angstroms, the substrate was dried at 80° C. for one minute and at 200° C. for one minute. The substrate was then sintered at 420° C. for 60 minutes on a hot plate in a nitrogen atmosphere. After forming a coating with a thickness of 2000 angstroms on the substrate using the organic insulating film-forming composition (C-1), the substrate was dried at 80° C. for one minute and at 200° C. for one minute. The substrate was then sintered at 420° C. for 60 minutes on a hot plate in a nitrogen atmosphere to form a laminate according to Example 15.

EXAMPLE 16

A CVD film of silane and ammonia was formed on an 8-inch silicon wafer to a thickness of 1000 angstroms using a Sequel Express manufactured by Nevellus. The elemental composition of the coating was Si (50 atomic %), 0 (4 atomic %), C (3 atomic %), N (40 atomic %), and H (4 atomic %). A copper film was stacked on the coating by sputtering to a thickness of 1000 angstroms. After applying the polybenzoxazole film-forming composition (A-2) to the copper film to a thickness of 500 angstroms, the substrate was sintered at 420° C. for 60 minutes on a hot plate in a nitrogen atmosphere. After applying the silica insulating film-forming composition (B-1) to the substrate to a thickness of 2000 angstroms, the substrate was dried at 80° C. for one minute and at 200° C. for one minute. The substrate was then sintered at 420° C. for 60 minutes on a hot plate in a nitrogen atmosphere. After forming a coating with a thickness of 2000 angstroms on the substrate using the organic insulating film-forming composition (C-2), the substrate was dried at 80° C. for one minute and at 200° C. for one minute. The substrate was then sintered at 420° C. for 60 minutes on a hot plate in a nitrogen atmosphere to form a laminate according to Example 16.

EXAMPLE 17

A CVD film of silane and ammonia was formed on an 8-inch silicon wafer to a thickness of 1000 angstroms using a Sequel Express manufactured by Nevellus. The elemental composition of the coating was Si (50 atomic %), 0 (4 atomic %), C (3 atomic %), N (40 atomic %), and H (4 atomic %). A copper film was stacked on the coating by sputtering to a thickness of 1000 angstroms. After applying the polybenzoxazole film-forming composition (A-1) to the copper film to a thickness of 500 angstroms, the substrate was sintered at 420° C. for 60 minutes on a hot plate in a nitrogen atmosphere. After applying the silica insulating film-forming composition (B-1) to the substrate to a thickness of 1800 angstroms, the substrate was dried at 80° C. for one minute and at 200° C. for one minute. The substrate was then sintered at 420° C. for 60 minutes on a hot plate in a nitrogen atmosphere. After forming a coating with a thickness of 500 angstroms on the substrate using the organic insulating film-forming composition (C-1), the substrate was dried at 80° C. for one minute and at 200° C. for one minute. The substrate was then sintered at 420° C. for 60 minutes on a hot plate in a nitrogen atmosphere. After forming a coating with a thickness of 1800 angstroms on the substrate using the silica film-forming composition (B-1), the substrate was dried at 80° C. for one minute and at 200° C. for one minute. The substrate was then sintered at 420° C. for 60 minutes on a hot plate in a nitrogen atmosphere to form a laminate according to Example 17.

EXAMPLE 18

A CVD film of silane and ammonia was formed on an 8-inch silicon wafer to a thickness of 1000 angstroms using a Sequel Express manufactured by Nevellus. The elemental composition of the coating was Si (50 atomic %), 0 (4 atomic %), C (3 atomic %), N (40 atomic %), and H (4 atomic %). A copper film was stacked on the coating by sputtering to a thickness of 1000 angstroms. After applying the polybenzoxazole film-forming composition (A-2) to the copper film to a thickness of 500 angstroms, the substrate was sintered at 420° C. for 60 minutes on a hot plate in a nitrogen atmosphere. After applying the silica insulating film-forming composition (B-1) to the substrate to a thickness of 1800 angstroms, the substrate was dried at 80° C. for one minute and at 200° C. for one minute. The substrate was then sintered at 420° C. for 60 minutes on a hot plate in a nitrogen atmosphere. After forming a coating with a thickness of 500 angstroms on the substrate using the organic insulating film-forming composition (C-2), the substrate was dried at 80° C. for one minute and at 200° C. for one minute. The substrate was then sintered at 420° C. for 60 minutes on a hot plate in a nitrogen atmosphere. After forming a coating with a thickness of 1800 angstroms on the substrate using the silica film-forming composition (B-1), the substrate was dried at 80° C. for one minute and at 200° C. for one minute. The substrate was then sintered at 420° C. for 60 minutes on a hot plate in a nitrogen atmosphere to form a laminate according to Example 18.

EXAMPLE 19

A CVD film of silane and ammonia was formed on an 8-inch silicon wafer to a thickness of 1000 angstroms using a Sequel Express manufactured by Nevellus. The elemental composition of the coating was Si (50 atomic %), 0 (4 atomic %), C (3 atomic %), N (40 atomic %), and H (4 atomic %). A copper film was stacked on the coating by sputtering to a thickness of 1000 angstroms. After applying the polybenzoxazole film-forming composition (A-1) to the copper film to a thickness of 500 angstroms, the substrate was sintered at 420° C. for 60 minutes on a hot plate in a nitrogen atmosphere. After forming a coating with a thickness of 4000 angstroms on the substrate using the organic insulating film-forming composition (C-1), the substrate was dried at 80° C. for one minute and at 200° C. for one minute. The substrate was then sintered at 420° C. for 60 minutes on a hot plate in a nitrogen atmosphere to form a laminate according to Example 19.

EXAMPLES 20 to 32

In Examples 20 to 32, a laminate according to each example was formed in the same manner as in Example 19 except for changing the polybenzoxazole resin film-forming composition used in Example 19 and the film-forming composition for the insulating layer in the first layer. Table 1 shows the polybenzoxazole film-forming composition and the organic insulating film-forming composition used in Examples 20 to 32.

EXAMPLE 33

A CVD film of silane and ammonia was formed on an 8-inch silicon wafer to a thickness of 1000 angstroms using a Sequel Express manufactured by Nevellus. The elemental composition of the coating was Si (50 atomic %), 0 (4 atomic %), C (3 atomic %), N (40 atomic %), and H (4 atomic %). A copper film was stacked on the coating by sputtering to a thickness of 1000 angstroms. After applying the polybenzoxazole film-forming composition (A-1) to the copper film to a thickness of 500 angstroms, the substrate was sintered at 420° C. for 60 minutes on a hot plate in a nitrogen atmosphere. After forming a coating with a thickness of 2000 angstroms on the substrate using the organic insulating film-forming composition (C-1), the substrate was dried at 80° C. for one minute and at 200° C. for one minute. The substrate was then sintered at 420° C. for 60 minutes on a hot plate in a nitrogen atmosphere. After forming a coating with a thickness of 2000 angstroms on the substrate using the silica insulating film-forming composition (B-1), the substrate was dried at 80° C. for one minute and at 200° C. for one minute. The substrate was then sintered at 420° C. for 60 minutes on a hot plate in a nitrogen atmosphere to form a laminate according to Example 33.

EXAMPLE 34

A CVD film of silane and ammonia was formed on an 8-inch silicon wafer to a thickness of 1000 angstroms using a Sequel Express manufactured by Nevellus. The elemental composition of the coating was Si (50 atomic %), 0 (4 atomic %), C (3 atomic %), N (40 atomic %), and H (4 atomic %). A copper film was stacked on the coating by sputtering to a thickness of 1000 angstroms. After applying the polybenzoxazole film-forming composition (A-2) to the copper film to a thickness of 500 angstroms, the substrate was sintered at 420° C. for 60 minutes on a hot plate in a nitrogen atmosphere. After forming a coating with a thickness of 2000 angstroms on the substrate using the organic insulating film-forming composition (C-2), the substrate was dried at 80° C. for one minute and at 200° C. for one minute. The substrate was then sintered at 420° C. for 60 minutes on a hot plate in a nitrogen atmosphere. After forming a coating with a thickness of 2000 angstroms on the substrate using the silica insulating film-forming composition (B-1), the substrate was dried at 80° C. for one minute and at 200° C. for one minute. The substrate was then sintered at 420° C. for 60 minutes on a hot plate in a nitrogen atmosphere to form a laminate according to Example 34.

EXAMPLE 35

A CVD film of silane and ammonia was formed on an 8-inch silicon wafer to a thickness of 1000 angstroms using a Sequel Express manufactured by Nevellus. The elemental composition of the coating was Si (50 atomic %), 0 (4 atomic %), C (3 atomic %), N (40 atomic %), and H (4 atomic %). A copper film was stacked on the coating by sputtering to a thickness of 1000 angstroms. After applying the polybenzoxazole film-forming composition (A-1) to the copper film to a thickness of 500 angstroms, the substrate was sintered at 420° C. for 60 minutes on a hot plate in a nitrogen atmosphere. After forming a coating with a thickness of 1800 angstroms on the substrate using the organic insulating film-forming composition (C-1), the substrate was dried at 80° C. for one minute and at 200° C. for one minute. The substrate was then sintered at 420° C. for 60 minutes on a hot plate in a nitrogen atmosphere. After forming a coating with a thickness of 500 angstroms on the substrate using the silica insulating film-forming composition (B-1), the substrate was dried at 80° C. for one minute and at 200° C. for one minute. The substrate was then sintered at 420° C. for 60 minutes on a hot plate in a nitrogen atmosphere. After forming a coating with a thickness of 1800 angstroms on the substrate using the organic insulating film-forming composition (C-1), the substrate was dried at 80° C. for one minute and at 200° C. for one minute. The substrate was then sintered at 420° C. for 60 minutes on a hot plate in a nitrogen atmosphere to form a laminate according to Example 35.

EXAMPLE 36

A CVD film of silane and ammonia was formed on an 8-inch silicon wafer to a thickness of 1000 angstroms using a Sequel Express manufactured by Nevellus. The elemental composition of the coating was Si (50 atomic %), 0 (4 atomic %), C (3 atomic %), N (40 atomic %), and H (4 atomic %). A copper film was stacked on the coating by sputtering to a thickness of 1000 angstroms. After applying the polybenzoxazole film-forming composition (A-2) to the copper film to a thickness of 500 angstroms, the substrate was sintered at 420°

C. for 60 minutes on a hot plate in a nitrogen atmosphere. After forming a coating with a thickness of 1800 angstroms on the substrate using the organic insulating film-forming composition (C-2), the substrate was dried at 80° C. for one minute and at 200° C. for one minute. The substrate was then sintered at 420° C. for 60 minutes on a hot plate in a nitrogen atmosphere. After forming a coating with a thickness of 500 angstroms on the substrate using the silica insulating film-forming composition (B-1), the substrate was dried at 80° C. for one minute and at 200° C. for one minute. The substrate was then sintered at 420° C. for 60 minutes on a hot plate in a nitrogen atmosphere. After forming a coating with a thickness of 1800 angstroms on the substrate using the organic insulating film-forming composition (C-2), the substrate was dried at 80° C. for one minute and at 200° C. for one minute. The substrate was then sintered at 420° C. for 60 minutes on a hot plate in a nitrogen atmosphere to form a laminate according to Example 36.

EXAMPLE 37

After forming a coating with a thickness of 1000 angstroms on the laminate obtained in Example 17 using the silica hard mask film-forming composition (B-2), the substrate was dried at 80° C. for one minute and at 200° C. for one minute. The substrate was then sintered at 420° C. for 60 minutes on a hot plate in a nitrogen atmosphere to form a laminate according to Example 37.

EXAMPLE 38

After forming a coating with a thickness of 1000 angstroms on the laminate obtained in Example 18 using the silica hard mask film-forming composition (B-2), the substrate was dried at 80° C. for one minute and at 200° C. for one minute. The substrate was then sintered at 420° C. for 60 minutes on a hot plate in a nitrogen atmosphere to form a laminate according to Example 38.

EXAMPLE 39

After forming a coating with a thickness of 1000 angstroms on the laminate obtained in Example 17 using the organic hard mask film-forming composition (D), the substrate was dried at 80° C. for one minute and at 200° C. for one minute. The substrate was then sintered at 420° C. for 60 minutes on a hot plate in a nitrogen atmosphere to form a laminate according to Example 39.

EXAMPLE 40

After applying the organic hard mask film-forming composition (D) to the laminate obtained in Example 18 to a thickness of 1000 angstroms, the substrate was dried at 80° C. for one minute and at 200° C. for one minute. The substrate was then sintered at 420° C. for 60 minutes on a hot plate in a nitrogen atmosphere to form a laminate according to Example 40.

COMPARATIVE EXAMPLE

A CVD film of silane and ammonia was formed on an 8-inch silicon wafer to a thickness of 1000 angstroms using a Sequel Express manufactured by Nevellus. The elemental composition of the coating was Si (50 atomic %), 0 (4 atomic %), C (3 atomic %), N (40 atomic %), and H (4 atomic %). A copper film was stacked on the coating by sputtering to a thickness of 1000 angstroms. After applying the silica insulating film-forming composition (2) to the copper film to a thickness of 4000 angstroms, the substrate was dried at 80° C. for one minute and at 200° C. for one minute. The substrate was then sintered at 420° C. for 60 minutes on a hot plate in a nitrogen atmosphere. The dielectric breakdown voltage of the resulting laminate film was 3.5 MV/cm.

Table 1 shows the combinations of the film-forming compositions (varnish) used when forming the laminates obtained in Examples 1 to 40 and the comparative example and the dielectric breakdown voltages of the resulting laminates.

TABLE 1

| | Protective layer | First insulating layer | Second insulating layer | Third insulating layer | Hard mask | Dielectric breakdown voltage (MV/cm) |
|---|---|---|---|---|---|---|
| Example 1 | A-1 | B-1 | | | | 6.0 |
| Example 2 | A-2 | B-1 | | | | 5.7 |
| Example 3 | A-3 | B-1 | | | | 6.1 |
| Example 4 | A-4 | B-1 | | | | 6.1 |
| Example 5 | A-5 | B-1 | | | | 5.8 |
| Example 6 | A-6 | B-1 | | | | 6.3 |
| Example 7 | A-7 | B-1 | | | | 5.7 |
| Example 8 | A-8 | B-1 | | | | 5.9 |
| Example 9 | A-9 | B-1 | | | | 6.0 |
| Example 10 | A-10 | B-1 | | | | 5.8 |
| Example 11 | A-11 | B-1 | | | | 6.2 |
| Example 12 | A-12 | B-1 | | | | 5.9 |
| Example 13 | A-13 | B-1 | | | | 6.2 |
| Example 14 | A-14 | B-1 | | | | 6.1 |
| Example 15 | A-1 | B-1 | C-1 | | | 6.3 |
| Example 16 | A-2 | B-1 | C-2 | | | 5.9 |
| Example 17 | A-1 | B-1 | C-1 | B-1 | | 5.9 |
| Example 18 | A-2 | B-1 | C-2 | B-1 | | 6.1 |
| Example 19 | A-1 | C-1 | | | | 6.2 |
| Example 20 | A-2 | C-2 | | | | 5.8 |
| Example 21 | A-3 | C-1 | | | | 6.0 |
| Example 22 | A-4 | C-2 | | | | 6.1 |
| Example 23 | A-5 | C-1 | | | | 5.9 |
| Example 24 | A-6 | C-2 | | | | 6.2 |
| Example 25 | A-7 | C-1 | | | | 5.8 |
| Example 26 | A-8 | C-2 | | | | 5.8 |
| Example 27 | A-9 | C-1 | | | | 6.3 |
| Example 28 | A-10 | C-2 | | | | 5.9 |
| Example 29 | A-11 | C-1 | | | | 6.2 |
| Example 30 | A-12 | C-2 | | | | 5.7 |
| Example 31 | A-13 | C-1 | | | | 5.7 |
| Example 32 | A-14 | C-2 | | | | 6.0 |
| Example 33 | A-1 | C-1 | B-1 | | | 5.8 |
| Example 34 | A-2 | C-2 | B-1 | | | 6.0 |
| Example 35 | A-1 | C-1 | B-1 | C-1 | | 6.5 |
| Example 36 | A-2 | C-2 | B-1 | C-2 | | 6.2 |
| Example 37 | A-1 | B-1 | C-1 | B-1 | B-2 | 6.4 |
| Example 38 | A-2 | B-1 | C-2 | B-1 | B-2 | 6.3 |
| Example 39 | A-1 | B-1 | C-1 | B-1 | D | 6.3 |
| Example 40 | A-2 | B-1 | C-2 | B-1 | D | 6.2 |
| Comparative Example | | B-1 | | | | 3.5 |

As is clear from the results shown in Table 1, the laminates obtained in Examples 1 to 40 exhibited a dielectric breakdown voltage of 4 MV/cm or more. Therefore, it was confirmed that a laminate exhibiting an excellent dielectric breakdown resistance was obtained. On the other hand, the laminate of the comparative example exhibited a dielectric breakdown voltage of less than 4 MV/cm. Therefore, it was confirmed that an excellent insulating layer was not formed. As described above, since the laminate according to the invention includes the wiring layer including copper and the protective layer formed of the polybenzoxazole resin layer between the wiring layer and the insulating layer which covers the wiring layer, diffusion of copper into the insulating layer is reduced, whereby the laminate can be suitably used as an insulating layer for semiconductor devices.

The invention claimed is:

1. A laminate comprising:
a copper wiring layer provided over a semiconductor layer and having a specific pattern;
a protective layer formed of a polybenzoxazole resin layer provided on the copper wiring layer; and
an insulating layer provided on the protective layer and comprising a silica film and an organic film stacked in layers,
wherein the organic film is formed of polybenzoxazole and is in contact with the protective layer.

2. The laminate according to claim 1, further comprising a second organic film, wherein the organic film is a first organic film, and the first organic film, the silica film, and the second organic film are stacked in an order of the first organic film, the silica film and the second organic film.

3. The laminate according to claim 1, further comprising a hard mask layer provided on the insulating layer.

4. The laminate according to claim 1, wherein the polybenzoxazole resin layer is formed of a resin having a repeating unit of the following general formula (1),

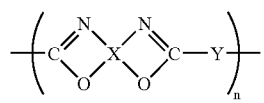

(1)

wherein X represents at least one group selected from groups of the following formula (2), Y represents at least one group selected from groups of the following formula (3), and n represents an integer from 1 to 10,000, (2)

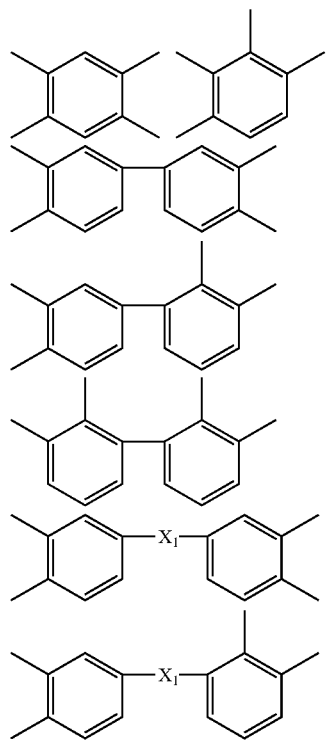

-continued

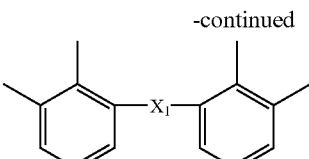

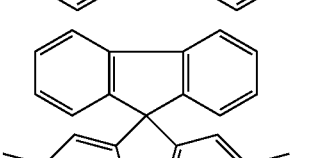

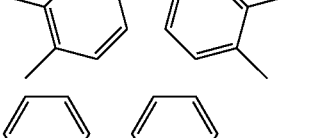

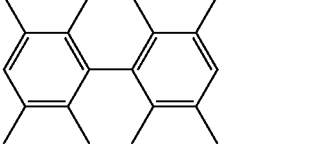

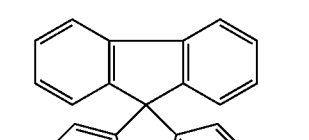

(3)

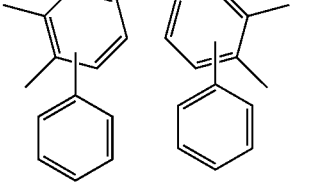

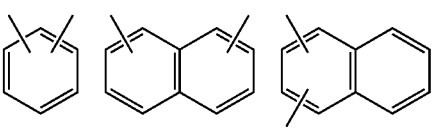

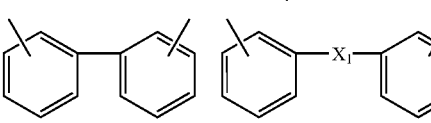

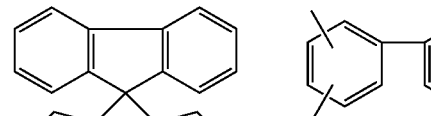

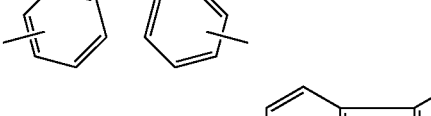

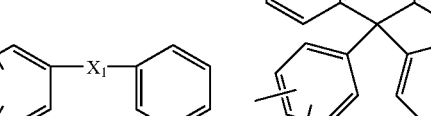

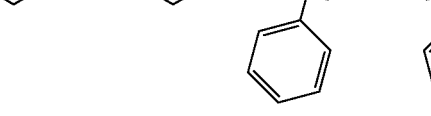

-continued wherein X₁ represents a group selected from groups of the following formula (4), (4)

provided that a hydrogen atom on the benzene ring of the groups of the formulas (2), (3), and (4) is optionally replaced with a crosslinking group, or is optionally replaced with at least one organic group which is selected from aliphatic groups and aromatic groups and optionally have a crosslinking group.

5. The laminate according to claim 4, wherein the polybenzoxazole resin layer is formed of a resin having, as Y in the repeating unit of the general formula (1), at least one group selected from the groups of the formula (3) in which a hydrogen atom on the benzene ring is replaced with an ethynyl group or a phenylethynyl group.

6. The laminate according to claim 4, wherein the polybenzoxazole resin layer is formed of a resin having at least one group selected from groups of the following formula (5) or (6) as Y in the repeating unit of the general formula (1).

(5)

-continued
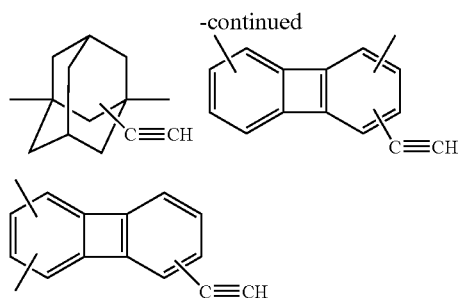
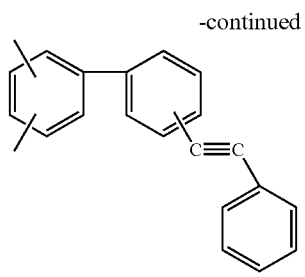
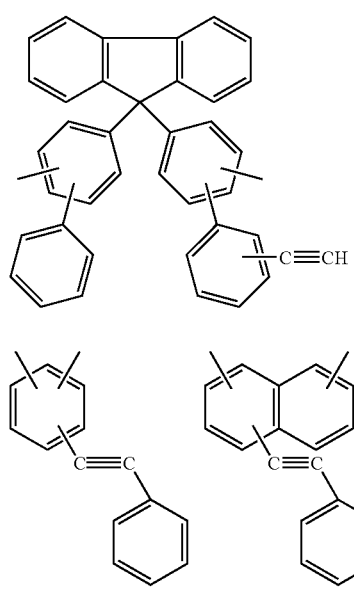
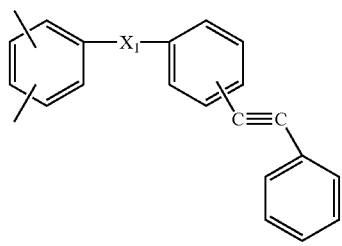
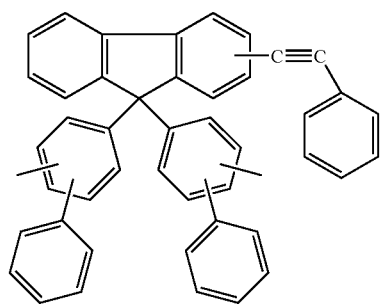
(6)
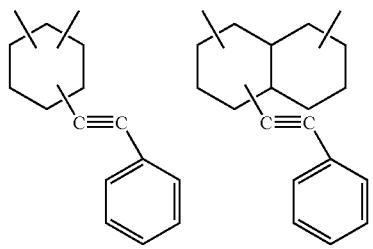
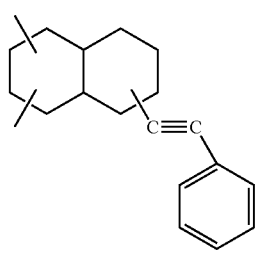
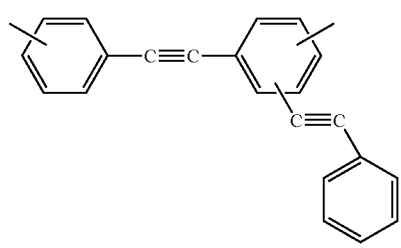

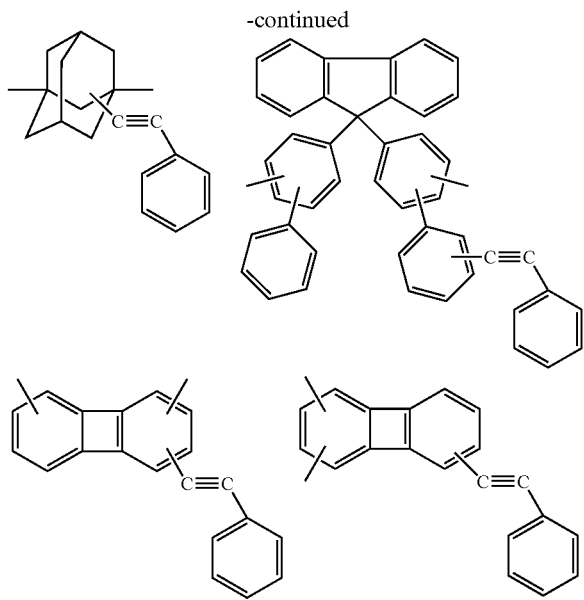

7. The laminate according to claim 1, wherein the silica film is a film produced by heating a hydrolysis-condensation product obtained by hydrolyzing and condensing at least one compound selected from the group consisting of compounds of the following general formulas (7) to (10), $$HSi(OR^1)_3 \quad (7)$$

wherein $R^1$ represents a monovalent organic group, $$R_a Si(OR^2)_{4-a} \quad (8)$$

wherein R represents a fluorine atom or a monovalent organic group, $R^2$ represents a monovalent organic group, and a represents an integer of 1 or 2, $$Si(OR^3)_4 \quad (9)$$

wherein $R^3$ represents a monovalent organic group, $$R^4{}_b(R^5O)_{3-b}Si{-}(R^8)_d{-}Si(OR^6)_{3-c}R^7{}_c \quad (10)$$

wherein $R^4$ to $R^7$ individually represent monovalent organic groups, b and c individually represent integers from 0 to 2, $R^8$ represents an oxygen atom, a phenylene group, or a group —(CH$_2$)— (wherein n represents an integer from 1 to 6), and d represents 0 or 1.

8. The laminate according to claim 3, wherein the hard mask layer is a layer including at least one of a silica film and an organic film.

9. A semiconductor device comprising a wiring layer formed in the insulating layer of the laminate according to claim 1 using a dual damascene method.

10. The laminate according to claim 1, wherein the organic film has a dielectric constant of 3 or less.

* * * * *